US008551275B2

(12) United States Patent
Tsumura

(10) Patent No.: US 8,551,275 B2
(45) Date of Patent: Oct. 8, 2013

(54) ADHESIVE APPLICATION METHOD AND TERMINAL JOINING METHOD

(75) Inventor: Shin Tsumura, Tokai (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 1192 days.

(21) Appl. No.: 11/277,679

(22) Filed: Mar. 28, 2006

(65) Prior Publication Data
US 2006/0219356 A1 Oct. 5, 2006

(30) Foreign Application Priority Data

Mar. 30, 2005 (JP) ................................ 2005-099567

(51) Int. Cl.
*B32B 37/00* (2006.01)
*B44C 1/17* (2006.01)

(52) U.S. Cl.
USPC ............. 156/235; 156/230; 156/292; 427/96; 427/207.1

(58) Field of Classification Search
USPC ....................................... 156/292; 427/207.1
IPC .................................... B32B 37/00; B44C 1/17
See application file for complete search history.

(56) References Cited

U.S. PATENT DOCUMENTS 3,646,670 A * 3/1972 Maeda et al. .................... 29/830
4,919,975 A * 4/1990 Jones ............................ 427/260
5,423,927 A * 6/1995 Laurent et al. .................... 156/64
5,753,299 A * 5/1998 Garcia et al. ..................... 427/76
6,945,299 B2 * 9/2005 Onodera et al. ............... 156/539
2003/0019568 A1* 1/2003 Liu et al. ........................ 156/245
2004/0043159 A1* 3/2004 Rzeznik et al. ............. 427/430.1

FOREIGN PATENT DOCUMENTS

| JP | H7297227 | | 11/1995 |
| JP | H09-290334 | A | 11/1997 |
| JP | H11251370 | | 9/1999 |
| JP | 2001274198 | | 10/2001 |
| JP | 2003-023036 | A | 1/2003 |

OTHER PUBLICATIONS

Japanese Patent Office, Notification of Reasons for Rejection of Patent Application No. JP 2005-099567, mailed Nov. 18, 2008.

* cited by examiner

*Primary Examiner* — Philip Tucker
*Assistant Examiner* — Shawn F Hogan
(74) *Attorney, Agent, or Firm* — Baker Botts L.L.P.

(57) ABSTRACT

Disclosed herein is an adhesive application method of applying adhesive to a protruding part formed on a substrate. The adhesive application method includes an adhesive preparing step of forming an adhesive layer on the surface of a plate member, an adhesive applying step of allowing the protruding part and the adhesive layer to be brought into contact with each other such that the surface of the substrate around the protruding part does not contact the adhesive layer, and a moving step of moving the substrate and the plate member relative to each other in the plane parallel with the surface of the plate member while the surface of the substrate around the protruding part is not in contact with the adhesive layer and the protruding part and the adhesive layer are in contact with each other.

16 Claims, 14 Drawing Sheets

Main Scanning Direction   Sub Scanning Direction

FIG. 6
(a)
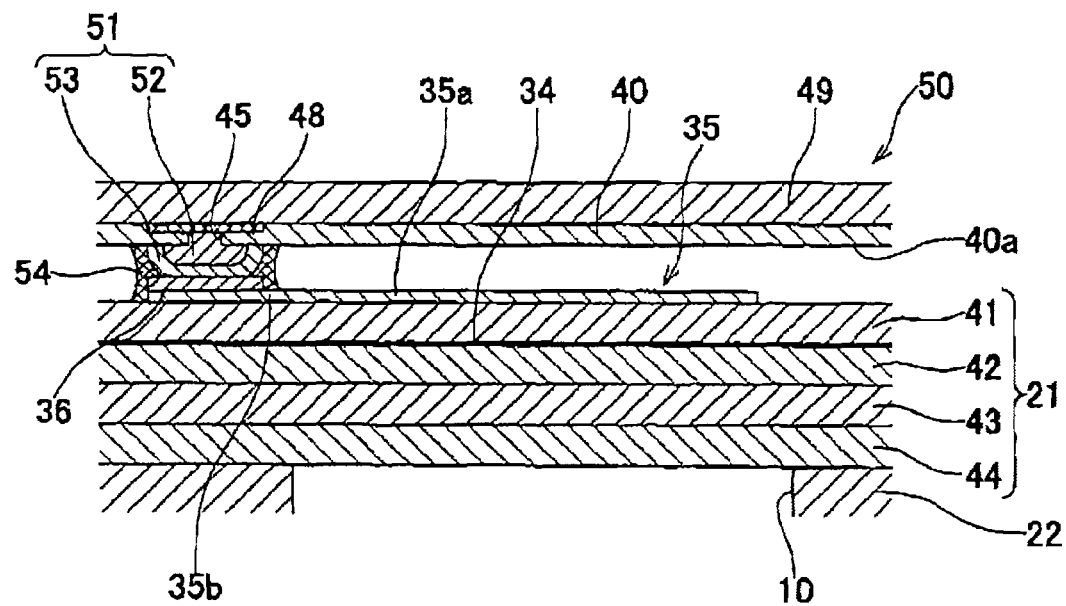
(b)
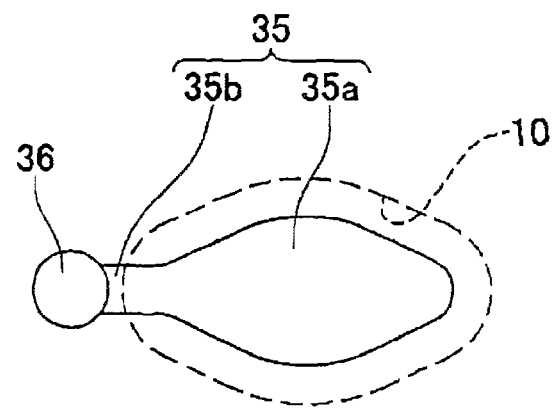

FIG. 11
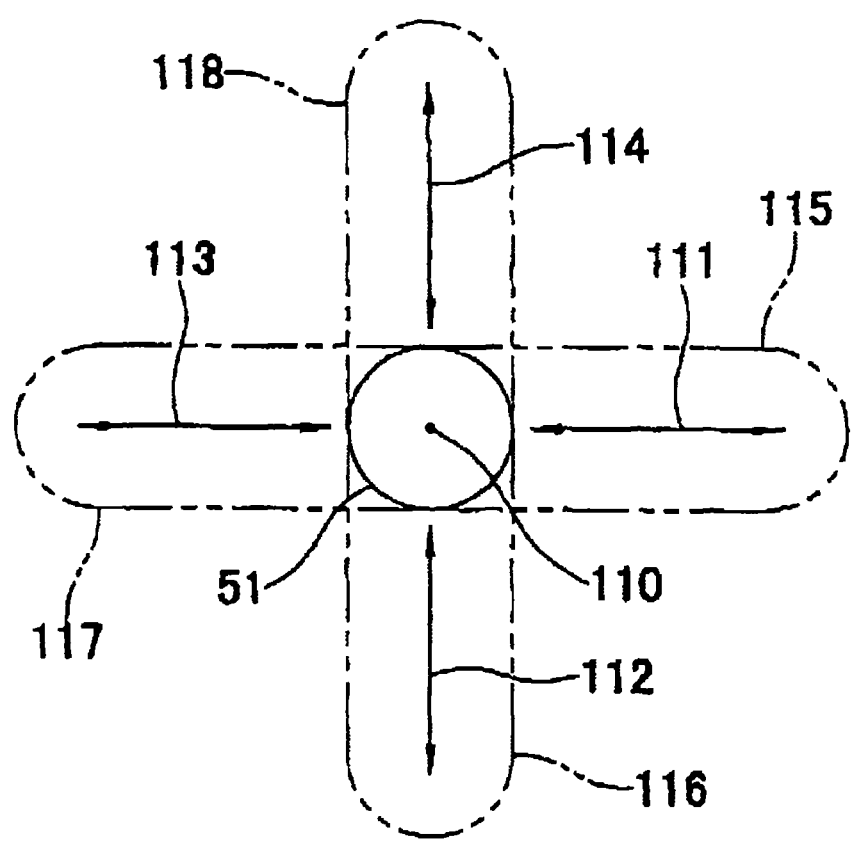
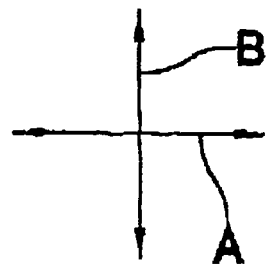

FIG. 12
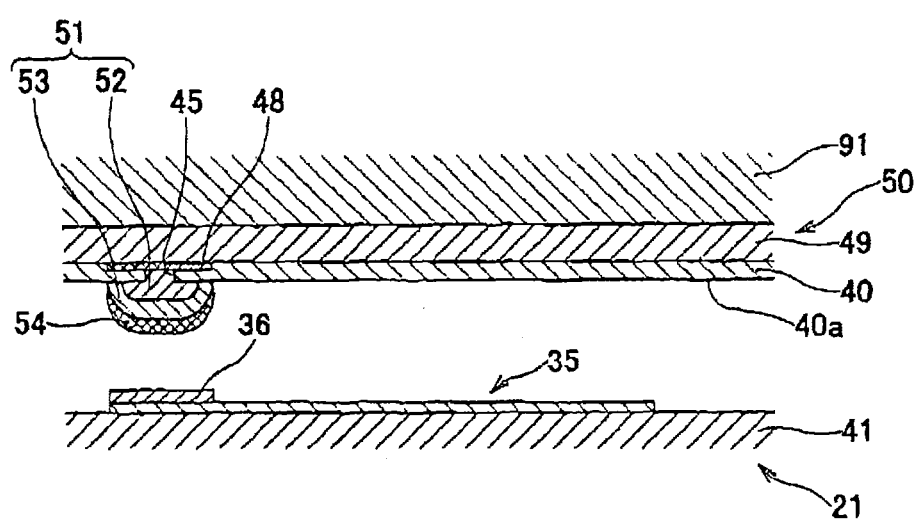
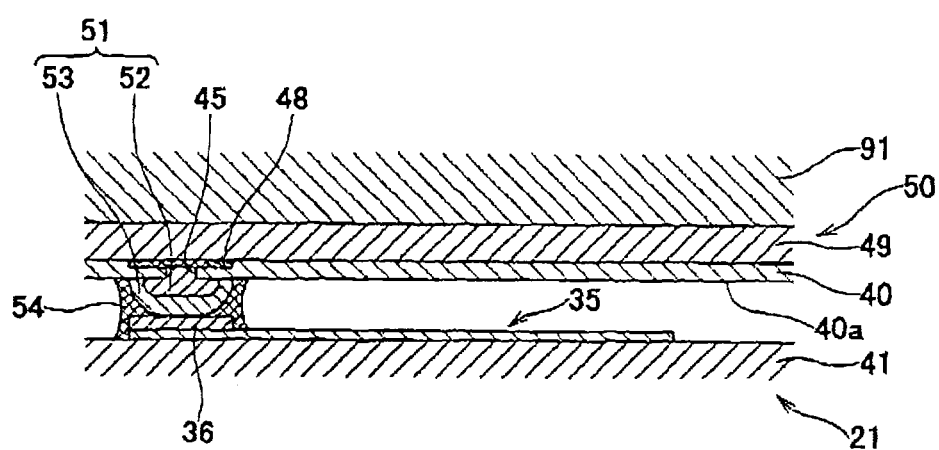
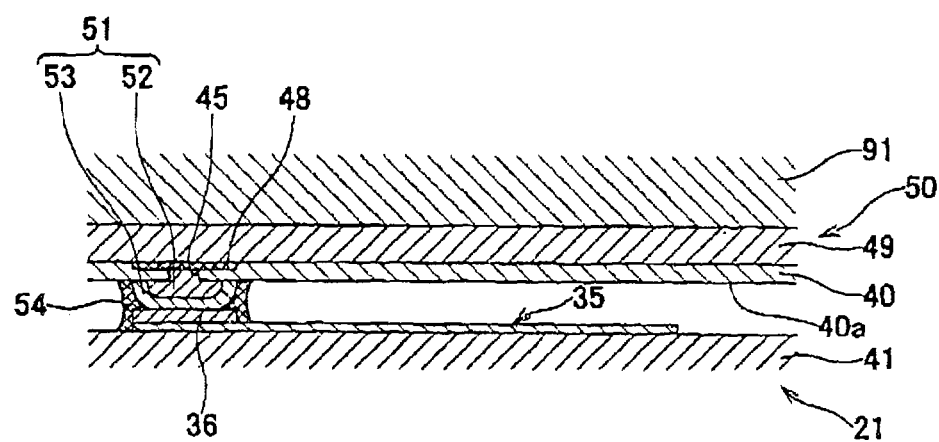

FIG. 13
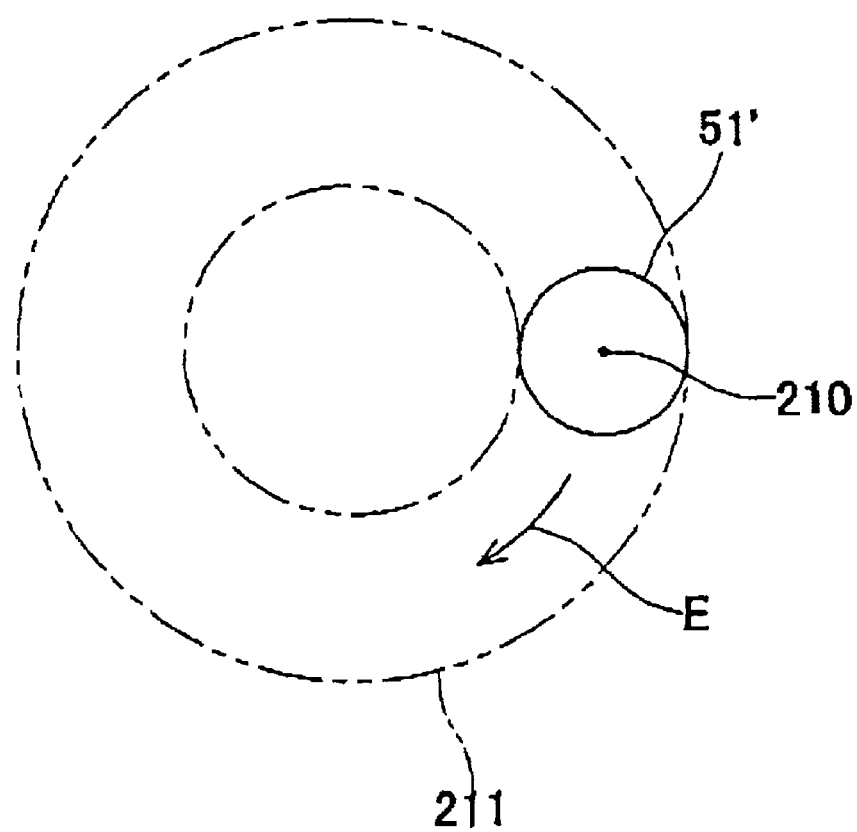
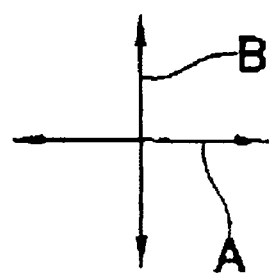

ADHESIVE APPLICATION METHOD AND TERMINAL JOINING METHOD

CROSS REFERENCE TO RELATED APPLICATIONS

This application claims priority to Japanese Patent Application No. 2005-099567, filed on Mar. 30, 2005. The contents thereof are hereby incorporated by reference into the present application.

BACKGROUND OF THE INVENTION

1. Field of the Invention

The present invention relates to an adhesive application method of applying adhesive to a protruding terminal formed on a substrate. Also, the present invention relates to a terminal joining method of joining a protruding terminal formed on a substrate and a terminal formed on another substrate.

2. Description of the Related Art

A method of applying adhesive to a protruding terminal formed on a substrate is disclosed in Japanese Unexamined Patent Publication No. H11-251370 (Columns 3 and 4, FIG. 1). According to this conventional method, conductive adhesive layer is formed on a flat plate using an adhesive supplying apparatus which supplies a small amount of adhesive. The thickness of the conductive adhesive layer is approximately a half of the height of a terminal (bump) formed on a semiconductor chip. After that, the terminal formed on the semiconductor chip is moved along the thickness direction of the conductive adhesive layer such that the terminal is pressed against the conductive adhesive layer, whereby a predetermined amount of adhesive is attached to the terminal.

BRIEF SUMMARY OF THE INVENTION

According to the conventional adhesive application method disclosed in Japanese Unexamined Patent Publication No. H11-251370, when the adhesive is attached to the terminal formed on the semiconductor chip, the semiconductor chip is moved only in the thickness direction of the semiconductor chip. For this reason, the adhesive is attached to only the leading edge of the terminal formed on the semiconductor chip. As a result, when the terminal formed on the semiconductor chip is joined to another terminal formed on another substrate, the amount of the adhesive attached to the terminal at the semiconductor chip side is small, and therefore, the joining strength between the terminal at the semiconductor chip side and the terminal at the substrate is decreased. Consequently, the joining parts between the terminals are easily separated from each other.

In order to attach a large amount of adhesive to the surface of the terminal formed on the semiconductor chip, on the other hand, a conductive adhesive layer is formed with the same thickness as the height of the terminal of the semiconductor chip. After that, the terminal formed on the semiconductor chip is moved in the thickness direction of the conductive adhesive layer such that the terminal is pressed against the conductive adhesive layer until the conductive adhesive reaches the root of the terminal, whereby the conductive adhesive is attached all over the surface of the terminal. When the adhesive is attached to the terminal as described above, however, the distance between the surface of the semiconductor chip around the terminal and the surface of the conductive adhesive layer is decreased. As a result, the conductive adhesive is attached to the surface of the semiconductor chip around the terminal. When the conductive adhesive is attached to the surface of the semiconductor chip around the terminal, the terminals of the semiconductor chip are electrically connected to each other, and therefore, a short circuit between the terminals occurs.

It is an object of the present invention to provide an adhesive application method that is capable of apply a large amount of adhesive to a protruding terminal formed on a substrate while preventing the adhesive from being attached to the remaining regions of the substrate except the protruding terminal.

It is another object of the present invention to provide a terminal joining method that is capable of joining a protruding terminal formed on a substrate and a terminal formed on another substrate.

In accordance with one aspect of the present invention, the above and other objects can be accomplished by the provision of an adhesive application method of applying adhesive to a protruding part formed on a substrate, wherein the adhesive application method comprises: an adhesive preparing step of forming an adhesive layer on the surface of a plate member; an adhesive applying step of allowing the protruding part and the adhesive layer to be brought into contact with each other such that the surface of the substrate around the protruding part does not contact the adhesive layer; and a moving step of moving the substrate and the plate member relative to each other in the plane parallel with the surface of the plate member while the surface of the substrate around the protruding part is not in contact with the adhesive layer and the protruding part and the adhesive layer are in contact with each other.

According to the adhesive application method as described above, at the moving step, the protruding part is moved while the adhesive forming the adhesive layer is gathered on the surface of the plate member by the protruding part. Consequently, the adhesive rises at the movement direction side of the protruding part in the vicinity of the protruding part. As a result, the adhesive is applied not only to the leading edge of the protruding part but also the other region of the protruding part, which is adjacent to the substrate. Furthermore, the adhesive is not attached to the surface of the substrate around the protruding part. Consequently, it is possible to omit a process of removing the adhesive from the surface of the substrate around the protruding part. Here, the terminology "the relative movement" means that the positional relations between the substrate and the plate member are changed in the plane parallel with the surface of the plate member. Specifically, it is possible to move the plate member while fixing the substrate, to move the substrate while fixing the plate member, or to move both the substrate and the plate member.

In accordance with one aspect of the present invention, there is provided a terminal joining method of joining a protruding terminal formed on a first substrate and a terminal formed on a second substrate, which is different from the first substrate, wherein the terminal joining method comprises: a protruding terminal forming step of forming the protruding terminal on the first substrate; a terminal forming step of forming the terminal on the second substrate; an adhesive preparing step of forming an adhesive layer on the surface of a plate member; an adhesive applying step of allowing the protruding terminal and the adhesive layer to be brought into contact with each other such that the surface of the first substrate does not contact the adhesive layer; a moving step of moving the first substrate and the plate member relative to each other in the plane parallel with the surface of the plate member while the surface of the first substrate is not in contact with the adhesive layer and the protruding terminal and the adhesive layer are in contact with each other; and a joining step of heating and pressing the protruding terminal and the terminal while the protruding terminal and the terminal are in contact with each other.

According to the terminal joining method as described above, at the moving step, the protruding terminal is moved while the adhesive forming the adhesive layer is gathered by the protruding part on the surface of the plate member. Consequently, the adhesive rises at the movement direction side of the protruding terminal in the vicinity of the protruding terminal. As a result, the adhesive is applied not only to the leading edge of the protruding terminal but also the other regions of the protruding terminal, which are adjacent to the first substrate. Furthermore, the adhesive is not attached to the surface of the first substrate around the protruding terminal. Consequently, it is possible to omit a process of removing the adhesive from the surface of the substrate around the protruding part. Furthermore, the adhesive is also applied to the region of the protruding terminal adjacent to the first substrate, and therefore, the joining strength between the protruding terminal and the terminal formed on the second substrate is increased.

BRIEF DESCRIPTION OF THE DRAWINGS

The above and other objects, features and other advantages of the present invention will be more clearly understood from the following detailed description taken in conjunction with the accompanying drawings.

FIG. 6 shows an actuator unit and a flexible printed circuit. FIG. 6 (a) shows a sectional view illustrating joining between an actuator unit and a flexible printed circuit (hereinafter, referred to as "FPC"). FIG. 6 (b) shows an enlarged plan view illustrating the actuator unit.

FIG. 11 shows a view illustrating movement paths of each protruding terminal formed on the FPC according to a first preferred embodiment of the present invention.

FIG. 12 shows sectional views illustrating a process of joining the head body and the FPC.

FIG. 13 shows a view illustrating a movement path of each protruding terminal formed on the FPC according to a second preferred embodiment of the present invention.

DETAILED DESCRIPTION OF THE INVENTION

Figure 1:
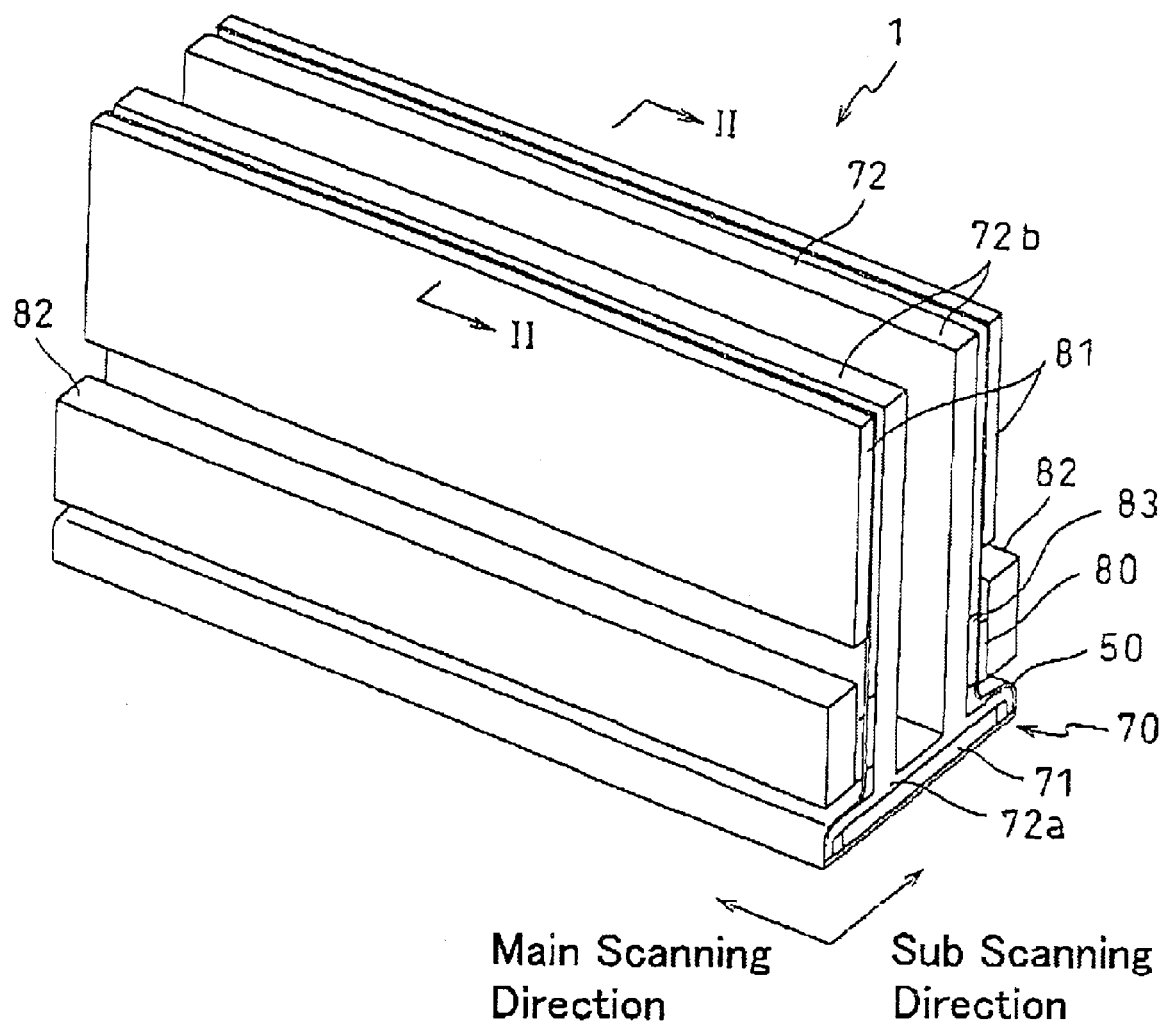
FIG. 1 shows a perspective view illustrating the external appearance of an ink jet head.

It is preferable that the maximally protruding portion of the protruding part is parallel with the substrate.

According to this method, the area of the leading edge of the protruding part is increased, and therefore, it is possible to apply a large amount of the adhesive to the leading edge of the protruding part.

It is preferable that, at the moving step, the substrate and the plate member are reciprocated relative to each other in the plane parallel with the surface of the plate member. Alternatively, it is preferred that, at the moving step, the substrate and the plate member are reciprocated relative to each other in two different directions in the plane parallel with the surface of the plate member.

According to this method, it is possible to apply a large amount of the adhesive to a large area of the protruding part adjacent to the substrate. In the latter case, the protruding part is moved in four directions, and therefore, it is possible to apply a large amount of the adhesive to a larger area of the protruding part adjacent to the substrate.

It is preferable that, at the moving step, the substrate and the plate member are reciprocated relative to each other in first and second directions, which are perpendicular to each other, in the plane parallel with the surface of the plate member.

According to this method, it is possible to apply a large amount of the adhesive almost all over the protruding part adjacent to the substrate.

It is preferable that, at the moving step, the center of the relative reciprocating movement of the substrate and the plate member in the first direction is identical to that of relative reciprocating movement of the substrate and the plate member in the second direction.

According to this method, it is possible to apply a large amount of the adhesive almost all over the protruding part adjacent to the substrate.

The adhesive application method as set forth in claim 1, wherein, the moving step comprises following: a first moving step, wherein the substrate and the plate member are reciprocated relative to each other in a third direction in the plane parallel with the surface of the plate member; a second moving step, wherein the substrate and the plate member are reciprocated relative to each other in a fourth direction, which differs from the third direction, in the plane parallel with the surface of the plate member; a third moving step, wherein the substrate and the plate member are reciprocated relative to each other in a fifth direction, which differs from the third and fourth directions, in the plane parallel with the surface of the plate member; and a fourth moving step, wherein the substrate and the plate member are reciprocated relative to each other in a sixth direction, which differs from the third to fifth directions, in the plane parallel with the surface of the plate member.

According to this method, it is possible to apply a large amount of the adhesive all over the protruding part adjacent to the substrate.

It is preferable that, at the moving step, the substrate and the plate member are moved relative to each other along the circumferential direction in the plane parallel with the surface of the plate member.

According to this method, the protruding part is moved fully along the circumferential direction of the protruding part though only one-time moving process. Consequently, it is possible to more uniformly and more efficiently apply a large amount of the adhesive all over the protruding part adjacent to the substrate.

It is preferable that, at the adhesive preparing step, the thickness of the adhesive layer formed on the surface of the plate member is uniform.

According to this method, when the substrate and the plate member are moved relative to each other, the adhesive is prevented from being attached to the surface of the substrate around the protruding part. Also, it is possible to uniformly apply a large amount of the adhesive to the region of the protruding part adjacent to the substrate.

It is preferable that, at the adhesive preparing step, the thickness of the adhesive layer is less than the distance from the leading edge of the protruding part formed on the substrate to the surface of the substrate around the protruding part, and, at the adhesive applying step, the leading edge of the protruding part is brought into contact with the surface of the plate member.

According to this method, it is possible to omit a process of performing a control operation such that the surface of the substrate around the protruding part is not brought into contact with the adhesive layer. Consequently, it is possible to apply the adhesive only to the protruding part by a simple process.

It is preferable that, the terminal joining method further comprises: a solder film forming step of forming a solder film such that the protruding terminal is covered by the solder film, the solder film having a melting point less than that of the material constituting the protruding terminal. It is preferable that, at the adhesive preparing step, a thermosetting adhesive layer is formed on the surface of the plate member, and, at the joining step, the protruding terminal and the terminal are heated to a temperature higher than the setting temperature of the thermosetting adhesive and a temperature lower than the melting point of the material constituting the protruding terminal and the melting point of solder constituting the solder film.

According to this method, the joining strength between the protruding terminal formed on the first substrate and the terminal formed on the second substrate is further increased. Furthermore, the protruding terminal formed on the first substrate and the terminal formed on the second substrate are heated to a temperature lower than the melting point of solder, and therefore, the solder film is softened, but not melted. As a result, the solder is prevented from flowing out of the region surrounded by the thermosetting adhesive. Also, since the solder film is softened, the gap between the protruding terminal and the terminal formed on the second substrate is filled with the solder. Consequently, the electrical contact area between the protruding terminal and the terminal formed on the second substrate is increased.

It is preferable that, the terminal joining method further comprises: a solder film forming step of forming a solder film such that the protruding terminal is covered by the solder film, the solder film having a melting point less than that of the material constituting the protruding terminal. It is preferable that, at the adhesive preparing step, a thermosetting adhesive layer is formed on the surface of the plate member, and, at the joining step, the protruding terminal and the terminal are heated to a temperature higher than the melting point of solder constituting the solder film and the setting temperature of the thermosetting adhesive and a temperature lower than the melting point of the material constituting the protruding terminal.

According to this method, the protruding terminal formed on the first substrate and the terminal formed on the second substrate are joined to each other by means of the thermosetting adhesive and the solder at the joining step. Consequently, the joining strength between the protruding terminal and the terminal of the second substrate is remarkably increased.

It is preferable that the solder constituting the solder film is made of a solder containing no lead, even in the case that the protruding terminal and the terminal are healed to a temperature higher than the setting temperature of the thermosetting adhesive and a temperature lower than the melting point of the material constituting the protruding terminal and the melting point of the solder at the joining step.

In the case that the solder containing no lead is used, the lead is prevented from flowing out when the product is manufactured or disassembled. Generally, the solder containing no lead has a high melting point. For example, a tin-silver-copper (Sn—Ag—Cu) alloy having a melting point of 218° C. is used as the solder.

It is preferable that, the protruding terminal is made of a metal mainly containing nickel. When the nickel is used, the tight contact between the protruding terminal and the solder film is improved.

It is preferable that, at the adhesive preparing step, the thickness of the adhesive layer is less than the distance from the leading edge of the protruding terminal formed on the first substrate to the surface of the substrate around the protruding part, and, at the moving step, the substrate and the plate member are moved relative to each other in the plane parallel with the surface of the plate member while the leading edge of the protruding terminal is in contact with the surface of the plate member.

According to this method, it is possible to omit a process of performing a control operation such that the surface of the substrate around the protruding part is not brought into contact with the adhesive layer. Consequently, it is possible to apply the adhesive only to the protruding terminal by a simple process.

It is also preferable that, at the adhesive layer forming step, the thickness of the adhesive layer is less than the distance from the leading edge of the protruding terminal formed on the first substrate to the surface of the substrate around the protruding terminal, and, at the contacting step, the substrate and the plate member are moved relative to each other in the plane parallel with the surface of the plate member while the leading edge of the first terminal is in contact with the surface of the plate member. Consequently, the adhesive is unlikely to become attached to the first substrate without needing to perform any special control.

Figure 2:
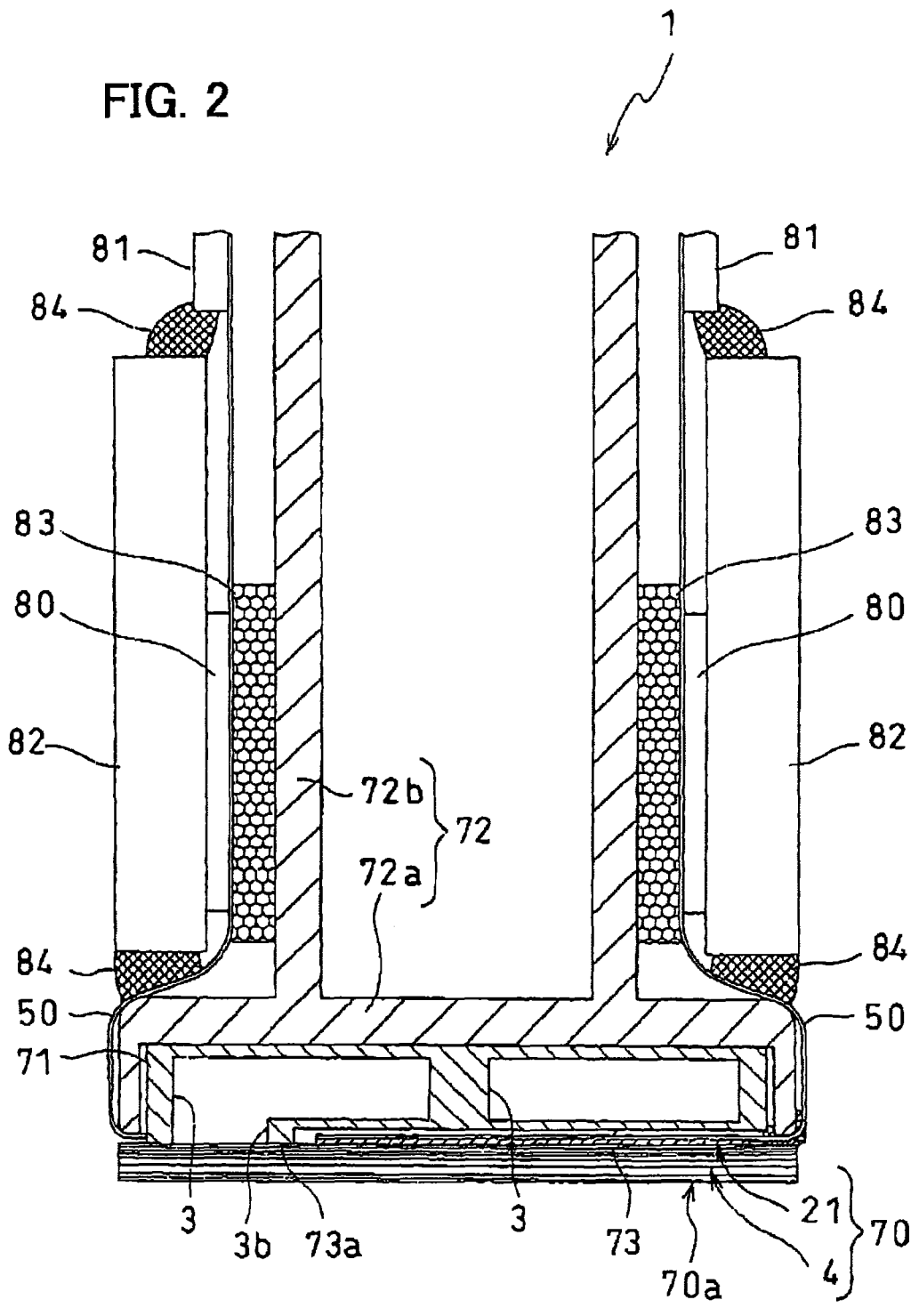
FIG. 2 shows a sectional view of the ink jet head taken along line II-II of FIG. 1.

A first embodiment of the present invention will be described in detail with reference to the accompanying drawings. FIG. 1 shows a perspective view illustrating the external appearance of an ink jet head 1 according to the first embodiment of the present invention, and FIG. 2 shows a sectional view of the ink jet head 1 taken along line II-II of FIG. 1. The ink jet head 1 includes a head body 70, a base block 71, a holder 72, flexible printed circuits (hereinafter, referred to as "FPCs") 50, driver integrated circuits (hereinafter, referred to as "driver ICs") 80, heat sinks 82, and substrates 81.

The bottom of the head body 70 is formed in the shape of a rectangle having a long side extending in the main scanning direction (see FIGS. 1 and 2). At the bottom of the head body 70 is provided an ink discharge surface 70a. At the ink discharge surface 70a are formed a plurality of small-diameter nozzles 8 for discharging ink to paper. The nozzles 8 will be described below in detail with reference to FIG. 5. The head body 70 includes a passage unit 4 having an ink passage and a plurality of actuator units 21 attached to the upper surface of the passage unit 4 by means of thermosetting adhesive.

The base block 71 is disposed on the head body 70. The base block 71 is made of a metal material, such as stainless steel. In the base block 71 is formed an ink chamber 3. The ink chamber 3 is a hollow region approximately formed in the shape of a rectangular parallelepiped extending along the main scanning direction. The ink chamber 3 is provided at one end thereof with an opening (not shown), through which ink is supplied to the ink chamber 3 form an ink tank (not shown) located outside the ink chamber 3 such that the ink chamber 3 is always filled with ink. At the lower part of the ink chamber 3 are formed ink outflow openings 3b, through which ink flows out.

The base block 71 has a lower surface 73, which is located lower than the periphery of the base block 71 at surrounding parts 73a of the openings 3b. The base block 71 is in contact with the upper surface of the passage unit 4 only at the surrounding parts 73a of the openings 3b. As a result, the base block 71 is not in contact with the head body 70 in other regions except the surrounding part 73a. Specifically, a gap is provided between the base block 71 and the head body 70, and the actuator units 21 and the FPCs 50 are disposed in the gap.

The holder 72 includes a supporting part 72a for supporting the base block 71, and a pair of supporting parts 72b Formed such that the supporting parts 72b are spaced apart from each other in the sub scanning direction (see FIGS. 1 and 2) and extend upward from the upper surface of the supporting part 72a. The base block 71 is fixed in a depression formed on the lower surface of the supporting part 72a.

The FPCs 50 are connected to the upper surface of the head body 70. The FPCs 50 extend out of the gap between the base block 71 and the actuator units 21, and are disposed along the surfaces of the supporting parts 72b via elastic members 83, such as sponge.

The driver ICs 80 are disposed at the surfaces of the corresponding FPCs 50, and are electrically connected with the corresponding FPCs 50. Since the FPCs 50 and the actuator units 21 are electrically connected with each other, drive signals outputted from the driver ICs 80 are transmitted to the actuator units 21 through the FPCs 50.

The heat sinks 82 are disposed at the outer surfaces of the corresponding driver ICs 80 while the heat sinks 82 are in tight contact with the corresponding driver ICs 80 that approximately formed in the shape of a rectangle. The heat sinks 82 serve to efficiently dissipate heat generated from the driver ICs 80.

The substrates 81 are connected to the outsides of the corresponding FPCs 50 above the driver ICs 80 and the heat sinks 82.

Between the upper ends of the heat sinks 82 and the substrates 81 and between the lower ends of the heat sinks 82 and the FPCs 50 are disposed sealing members 84 for preventing dust or ink from penetrating into the ink jet head 1.

Figure 3:
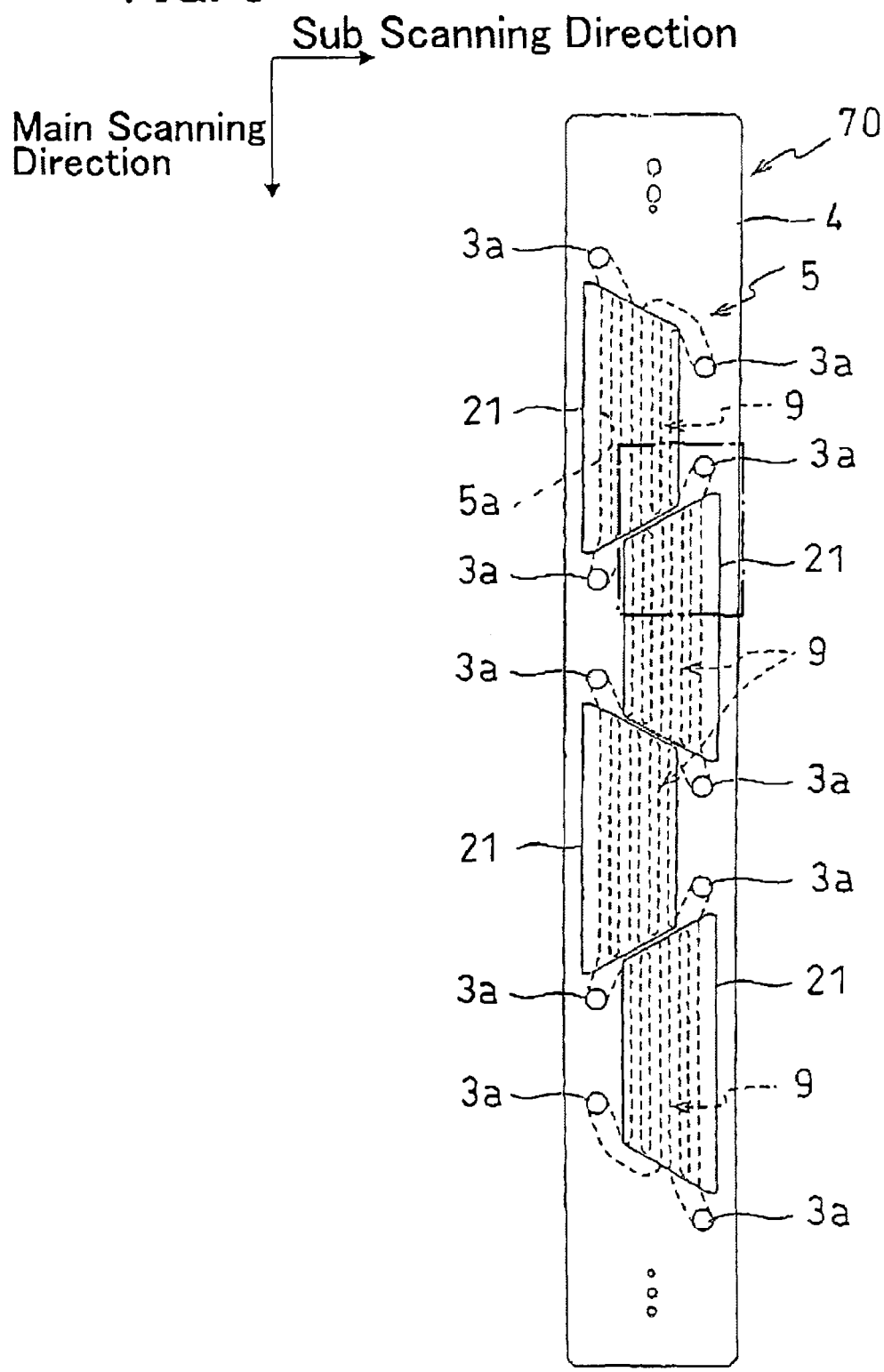
FIG. 3 shows a plan view illustrating a head body shown in FIG. 2 as seen from above.

FIG. 3 shows a plan view illustrating the head body 70 as seen from above. As shown in FIG. 3, the passage unit 4 has a rectangle shape long in the main scanning direction. Openings 3a are provided at opposite ends of the passage unit 4 in the sub scanning direction. Five openings 3a are disposed at each side of the passage unit 4 in the main scanning direction, and therefore, a total of ten openings 3a are disposed at the passage unit 4. The openings 3a are not arranged in the same lines in the sub scanning direction but are alternately arranged at the night and left sides of the passage unit 4 in the main scanning direction. The openings 3a communicate with manifold passages 5, which are indicated by broken lines. Ink is supplied from the ink chamber 3 of the base block 71 to the manifold passages 5 through the openings 3a. The openings 3b are connected to the respective opening 3a (see FIG. 2). Specifically, the ten openings 3a and the ten openings 3b, which correspond to the respective openings 3a, are disposed at the same positions as seen from above. The manifold passages 5 branch into a plurality of sub manifold passages 5a extending in parallel with the main scanning direction of the passage unit 4.

To the upper surface of the passage unit 4 are attached four actuator units 21, each of which is formed in the plan-view shape of a trapezoid. The plan-shaped parallel sides of the actuator units 21 are disposed along the main scanning direction of the passage unit 4, and the neighboring actuator units 21 are not in contact with each other. Also, the actuator units 21 are alternately arranged such that the actuator units 21 are not aligned with one another in the sub scanning direction and such that the actuator units 21 do not overlap with the openings 3a. As shown in FIG. 3, the plan-shaped oblique sides of neighboring actuator units 21 partially overlap with each other on when viewed in the sub scanning direction.

Figure 4:
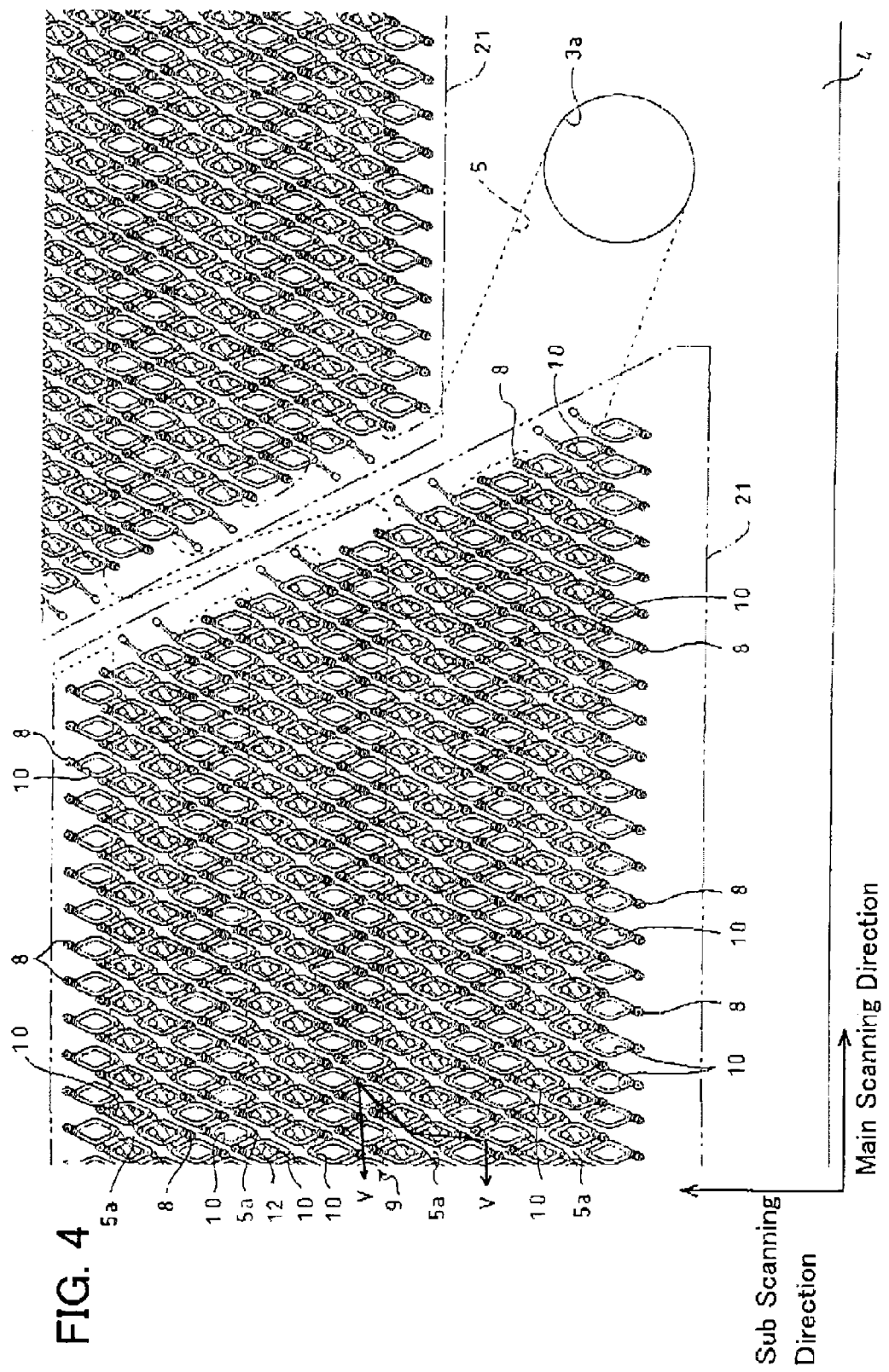
FIG. 4 shows an enlarged plan view illustrating a region surrounded by a dashed dot line of FIG. 3.

FIG. 4 shows an enlarged plan view illustrating a region surrounded by a dashed dot line of FIG. 3. Four sub manifold passages 5a (shown by dotted lines in the drawing) extend in parallel with the main scanning direction of the passage unit 4 at the region of the passage unit 4 opposite to each actuator unit 21. At the upper surface of the passage unit 4, which is opposite to each actuator unit 21, are formed a plurality of pressure chambers 10, each of which is approximately formed in the plan-view shape of a diamond (a rounded diamond). One end of the long diagonal line of each diamond-shaped pressure chamber 10 communicates with the corresponding nozzle 8. Also, the other end of the long diagonal line of each diamond-shaped pressure chamber 10 communicates with the corresponding sub manifold passage 5a through an aperture 12. Specifically, the sub manifold passages 5a communicate with the corresponding nozzles 8, and a plurality of ink passages 7 are connected to the sub manifold passages 5a through the respective nozzles 8. The ink passages 7 will be described below in detail with reference to FIG. 5. A pressure chamber group 9 is formed by the plurality of pressure chambers 10. The pressure chamber group 9 has almost the same shape as that of each actuator unit 21. Specifically, each actuator unit 21 is formed in the shape that can cover the plurality of pressure chambers 10 constituting the pressure chamber group 9. For easy understanding of the drawing, the pressure chambers 10 (the pressure chamber group 9), the apertures 12, and the nozzles 8 are shown by solid lines in FIG. 4, although the pressure chambers 10 (the pressure chamber group 9), the apertures 12, and the nozzles 8 should be shown by broken lines because the pressure chambers 10 (the pressure chamber group 9), the apertures 12, and the nozzles 8 are disposed below the actuator units 21.

Figure 5:
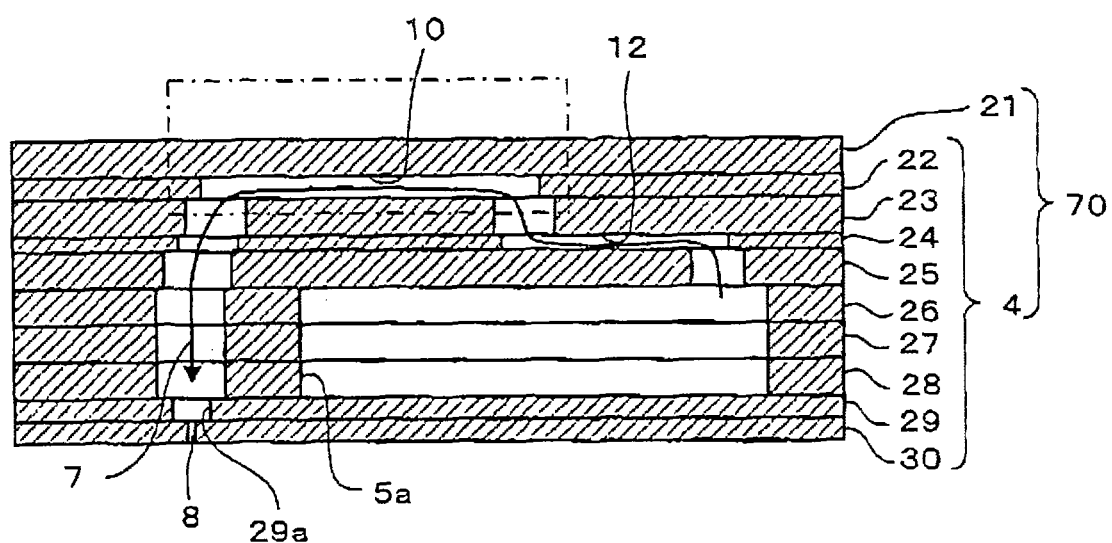
FIG. 5 shows a sectional view taken along line V-V of FIG. 4.

Now, the sectional structure of the head body 70 will be described. FIG. 5 is a sectional view of the head body 70 taken along line V-V of FIG. 4. The arrow shown in the drawing indicates the ink passage 7, along which ink flows from the sub manifold passage 5a to the nozzle 8. In this embodiment, the ink passage 7 extends upward from the sub manifold passage 5a, and then reaches one end of the pressure chamber 10 formed on the upper surface of the passage unit 4. Furthermore, the ink, passage 7 extends downward at an oblique angle from the other end of the horizontally extending pressure chamber 10, and is then connected to the nozzle 8 formed on the lower surface of the passage unit 4. As a whole, the ink passage 7 is formed in the shape of a bow having an apex at the pressure chamber 10. Because the ink passage 7 is formed in the above-described shape, it is possible to dispose the ink passages 7 at high density, and therefore, to allow ink to flow smoothly.

As shown in FIG. 5, the head body 70 is a laminated structure in which the actuator unit 21 is disposed at the upper side while the passage unit 4 is disposed at the lower side. Both the actuator unit 21 and the passage unit 4 are formed by laminating pluralities of thin plates. The actuator unit 21 includes four piezoelectric sheets and electrodes, which will be described below in detail with reference to FIG. 6.

The passage unit 4 is formed by laminating a total of nine sheets, specifically, a cavity plate 22, a base plate 23, an aperture plate 24, a supply plate 25, manifold plates 26 to 28, a cover plate 29, and a nozzle plate 30.

The cavity plate 22 is a metal plate. A plurality of holes, which are approximately formed in the shape of a diamond and constitute the space parts of the pressure chambers 10, are formed on the cavity plate 22. Specifically, the diamond-shaped holes are formed at the region of the cavity plate 22 where the actuator units 21 are attached.

The base plate 23 is a metal plate. The base plate 23 is attached to the lower surface of the cavity plate 22. Two holes are formed in the base plate 23. One of the holes (the left side of the drawing) forms a part of the passage, through which the pressure chamber 10 is connected to the nozzle 8. The other hole (the right side of the drawing) forms a passage, through which the pressure chamber 10 is connected to the aperture 12.

The aperture plate 24 is a metal plate. The aperture plate 24 is attached to the lower surface of the base plate 23. Two holes are formed in the aperture plate 24. One of the holes (the left side of the drawing) forms a part of the passage, through which the pressure chamber 10 is connected to the nozzle 8. The other hole (the right side of the drawing) forms an aperture 12.

The supply plate 25 is a metal plate. The supply plate 25 is attached to the lower surface of the aperture plate 24. Two holes are formed in the supply plate 25. One of the holes (the left side of the drawing) forms a part of the passage, through which the pressure chamber 10 is connected to the nozzle 8. The other hole (the right side of the drawing) forms a passage, through which the aperture 12 and the sub manifold passage 5a are connected with each other.

The manifold plates 26 to 28 are formed in the same shape. The manifold plates 26 to 28 are laminated one on another. The manifold plates 26 to 28 are metal plates. The manifold plates 26 to 28 are attached to the lower surface of the supply plate 25. Two holes are formed in the manifold plates 26 to 28. One of the holes (the left side of the drawing) forms a part of the passage, through which the pressure chamber 10 is connected to the nozzle 8. The other hole (the right side of the drawing) forms a sub manifold passage 5a.

The cover plate 29 is a metal plate. The cover plate 29 is attached to the lower surface of the manifold plate 28. A connection hole 29a is formed in the cover plate 29. The connection hole 29a is a part of the passage, through which the pressure chamber 10 is connected to the nozzle 8. The connection hole 29a is in direct contact with the nozzle 8.

The nozzle plate 30 is a metal plate. The nozzle plate 30 is attached to the lower surface of the cover plate 29. The nozzle 8 is formed in the nozzle plate 30.

One sub manifold passage 5a and one nozzle 8 are provided for each pressure chamber 10.

The nine plates 22 to 30 constituting the passage unit 4 are laminated such that the nine plates 22 to 30 are aligned with each other, whereby the individual ink passage 7 can be formed as shown in FIG. 5. In this embodiment, the nine plates 22 to 30 are made of the same metal material, for example, SUS430, although the nine plates 22 to 30 may be made of another metal material, such as SUS316 or 42 alloy. It is also possible to make some or all of the nine plates 22 to 30 of different metal materials.

As can be clearly understood from FIG. 5, the pressure chamber 10 and the aperture 12 are formed on different levels in the laminating direction of the respective plates. Consequently, as shown in FIG. 4, it is possible to place the aperture 12 connected to a pressure chamber 10 at the same positional relationship as another pressure chamber 10 adjacent to the pressure chamber in the passage unit 4 when seen in the laminating direction. As a result, it is possible to place the pressure chamber 10 in the cavity plate 22 at high density. Since the number of the nozzles is equal to that of the pressure chambers, it is possible to provide an ink jet head 1 that is capable of printing high-resolution pictures in a relatively small area.

Subsequently, joining between the actuator unit 21 and the FPC 50 will be described in detail. FIG. 6 (a) shows a sectional view illustrating the joining between actuator unit 21 and the FPC 50, and FIG. 6 (b) shows an enlarged plan view illustrating an individual electrode 35.

As shown in FIG. 6 (a), the actuator unit 21 includes four piezoelectric sheets 41 to 44, each of which has a thickness of approximately 15 μm. The piezoelectric sheets 41 to 44 are laminated one on another to form a flat plate 21, which covers the plurality of pressure chambers 10.

Since the flat plate 21 covers the plurality of pressure chambers 10, it is possible to place the individual electrodes 35 highly densely on the piezoelectric sheet 41, for example, a screen printing technology. As a result, the pressure chamber 10 formed at the position corresponding to the individual electrode 35 can also be placed at high density, and therefore, it is possible to provide an ink jet head 1 that is capable of printing high-resolution pictures.

The piezoelectric sheets 41 to 44 are made of a lead zirconate titanate (PZT)-based ceramic material having ferroelectricity.

The individual electrode 35 is formed on the upper surface of the piezoelectric sheet 41 such that the individual electrode 35 is opposite to the pressure chamber 10. Between the piezoelectric sheets 41 and 42 is disposed a common electrode 34, which has the same outer shape as the piezoelectric sheets 41 and 42 and has a thickness of approximately 2 μm. The individual electrode 35 and the common electrode 34 are made of a silver-palladium (Ag—Pd)-based metal material.

As shown in FIG. 6 (b), the individual electrode 35 includes a main electrode region 35a, which is formed inside the plane opposite to the pressure chamber 10, and a sub electrode region 35b, which is connected to the main electrode region 35a and is formed outside the plane opposite to the pressure chamber 10.

The main electrode region 35a of the individual electrode 35 is formed in almost the same shape as the pressure chamber 10. Specifically, the main electrode region 35a is approximately formed in the plan-view shape of a diamond (a rounded diamond). One of the acute angles of the diamond-shaped main electrode region 35a is connected to the sub electrode region 35b. The sub electrode region 35b is connected to a circular land 36 at the position opposite to the main electrode region 35a. The land 36 is disposed at the cavity plate 22 at the region where the pressure chamber 10 is not formed. The land 36 is made of, for example, gold containing glass frit. The land 36 is formed on the surface of the sub electrode region 35b.

The common electrode 34 is connected to a ground terminal at a predetermined region (not shown). Consequently, the common electrode 34 is always maintained at constant potential, in this embodiment, at constant ground potential, at the region corresponding to all of the pressure chambers 10.

Next, the FPC 50 will be described. As shown in FIG. 6 (a), the FPC 50 includes a base film 49, a wiring 48, and a cover film 40. The wiring 48 is made of copper foil. Specifically, a plurality of wirings 48 are formed on the lower surface of the base film 49. The cover film 40 covers almost all of the lower surface of the base film 49. In the cover film 40 are formed through-holes 45, which correspond to the respective wirings 48. As shown in FIG. 6 (a), the FPC 50 is in contact with the cover film 40 while the FPC 50 and the cover film 40 are aligned with each other so that the through-holes 45 are positioned at the center of wiring 48. The outside part of the surface of the wiring 48 is covered by the cover film 40. A protruding terminal 51 of the FPC 50 is joined to the surface of the wiring 48 through the through-hole 45. The unshown part of the wiring 48 is electrically connected to the driver IC 80.

The FPC 50 has a plurality of protruding terminals 51. The protruding terminals 51 are formed such that the protruding terminals correspond to the respective lands 36. Consequently, the individual electrodes 35, which are electrically joined to the respective lands 36, are connected to the driver IC 80 via the corresponding wirings 48, and therefore, it is possible to control the potential of the individual electrode 35 for each pressure chamber 10.

The base film 49 is a sheet-shaped film made of a material having electrical insulation. In this embodiment, the base film 49 is made of a polyimide resin. The cover film 40 is a sheet-shape film made of a material having electrical insulation. In this embodiment, the cover film 40 is made of a photosensitive material. When the cover film 40 is made of the photosensitive material, it is possible to easily form a plurality of through-holes 45.

Each protruding terminal 51 includes a main terminal body 52, which is made of, for example; a metal mainly containing nickel, and a solder film 53 formed such that the solder film 53 covers the surface of the main terminal body 52. The main terminal body 52 and the solder film 53 have electrical conductivity. The protruding terminal 51 blocks the through-hole 45, and covers the outer circumferential part of the through-hole 45 at a lower surface 40a of the cover film 40. Also, the protruding terminal 51 extends to a predetermined height, such that the protruding terminal 51 is formed in the shape of a protrusion, in the direction from the lower surface 40a to the piezoelectric sheet 41. As shown in FIG. 6 (a), the leading edge of the solder film 53 is electrically connected to the land 36. Furthermore, the piezoelectric sheet 41 is joined to the lower surface 40a of the cover film 40 by thermosetting adhesive 54 while the protruding terminal 51 and the land 36 are surrounded by the thermosetting adhesive 54. In this embodiment, the thermosetting adhesive 54 is an epoxy-based adhesive having electrical insulation. Since the protruding terminal 51 and the land 36 are joined to each other by the thermosetting adhesive 54 while the protruding terminal 51 and the land 36 are surrounded by the thermosetting adhesive 54, solder is prevented from flowing to the piezoelectric sheet 41 and the cover film 49 even though the solder film is melted during heating. Consequently, the plurality of individual electrodes 35 are prevented from short-circuiting.

In this embodiment, the solder film 53 is made of a tin-silver-copper (Sn—Ag—Cu) alloy. Specifically, the solder film 53 is made of a tin-silver-copper alloy having a chemical formula of Sn-3Ag-0.5Cu (lead is not added) and a melting point of 218° C. The tin-silver-copper alloy is manufactured by adding copper (Cu) to a tin-silver (Sn—Ag)-based solder having a high melting point.

It is also possible to make the solder film 53 of, for example, an alloy manufactured by adding another metal, such as bismuth (Bi), to the tin-silver-based solder. Furthermore, the solder film 53 may be made of a four-component alloy instead of the three-component alloy. In addition to the tin-silver-based solder, a tin-copper (Sn—Cu)-based or tin-stibium (Sn—Sb)-based alloy may be used as the solder having the high melting point. Also, a solder having a middle melting point or a solder having a low melting point may be used for the solder film 53 instead of the solder having the high melting point. For example, a tin-zinc (Sn—Zn)-based solder may be used as the solder having the middle melting point. Furthermore, a three-component alloy or a four-component alloy may be used as the solder having the middle melting point. For example, a tin-bismuth (Sn—Bi)-based solder or a tin-indium (Sn—In)-based solder may be used as the solder having the low melting point. Furthermore, a three-component alloy or a four-component alloy may be used as the solder having the low melting point. In the case that the solder film is made of any one of the above-mentioned materials, when the main terminal body 52 is made of a metal mainly containing nickel, the adhesion between the main terminal body 52 and the solder film 53 is improved.

Subsequently, a method of driving the actuator unit 21 will be described. The electrodes (the individual electrode 35 and the common electrode 34) are formed on the upper and lower surfaces of the piezoelectric sheet 41 of the actuator unit 21, and therefore, when an electric field is applied between the electrodes, the piezoelectric sheet 41 expands and contracts in the thickness direction. The other three piezoelectric sheets 42 to 44 do not provide electrodes on both sides. The piezoelectric sheet 41, which has the electrodes formed on the upper and lower surfaces thereof and expands and contracts in the thickness direction when the electric field is applied between the electrodes, will be referred to hereinafter as an "active layer" while the other three piezoelectric sheets 42 to 44, which have no electrodes formed on the upper and lower surfaces thereof, will be referred to hereinafter as an "inactive layer." The polarizing direction of the piezoelectric sheet 41 of the actuator unit 21 is the thickness direction of the piezoelectric sheet 41. The actuator unit 21 is formed in an unimorph type structure in which the single piezoelectric sheet 41 disposed at the upper part of the actuator unit 21 (i.e., the side away from the pressure chamber 10) is the active layer, and the three piezoelectric sheets 42 to 44 disposed at the lower part of the actuator unit 21 (i.e., the side adjacent to the pressure chamber 10) is the inactive layer. Consequently, in the case that the individual electrode 35 is maintained at a predetermined positive or negative potential, for example, if the electric field and the polarization are in the same direction, an electric field applying part of the piezoelectric sheet 41, which is inserted between the electrodes of the piezoelectric sheet 41, acts as an active part (a pressure generating part). The electric field applying part contracts in the direction perpendicular to the polarizing direction (i.e., in the direction parallel with the surface of the piezoelectric sheet 41) by the transversal piezoelectric effect.

In this embodiment, the part of the piezoelectric sheet 41 inserted between the individual electrode 35 and the common electrode 34 acts as the active part that generates distortion by the piezoelectric effect when the electric field is applied to the active part. On the other hand, no external electric field is applied to the three piezoelectric sheets 42 to 44, which are disposed under the piezoelectric sheet 41, and therefore, the piezoelectric sheets 42 to 44 do not act as the active part. Consequently, the part of the piezoelectric sheet 41 inserted between the main electrode region 35a and the common electrode 34 contracts in the direction perpendicular to the polarizing direction by the transversal piezoelectric effect.

On the other hand, the piezoelectric sheets 42 to 44 are not affected by the electric field, and therefore, the piezoelectric sheets 42 to 44 are not displaced spontaneously. Consequently, the distortion difference is caused in the direction perpendicular to the polarizing direction between the piezoelectric sheet 41 disposed at the upper part of the actuator unit 21 and the piezoelectric sheets 42 to 44 disposed at the lower part of the actuator unit 21. As a result, all of the piezoelectric sheets 41 to 44 are deformed such that the piezoelectric sheets 41 to 44 protrude toward the inactive layer (This is called unimorph deformation.).

At this time, since the lower surface of the actuator unit 21 constituted by the piezoelectric sheets 41 to 44 is fixed to the upper surface of the partition that partitions the pressure chamber (the cavity plate 22), as shown in FIG. 6 (a), the piezoelectric sheets 41 to 44 are deformed such that the piezoelectric sheets 41 to 44 protrude toward the pressure chamber side. Consequently, the volume of the pressure chamber 10 is decreased, and therefore, the pressure of the ink in the pressure chamber 10 is increased. As a result, the ink extruded from the pressure chamber 10 is discharged from the nozzle 8. After that, when the individual electrode 35 has the same potential as the common electrode 34, the piezoelectric sheets 41 to 44 are returned to their original state, and therefore, the volume of the pressure chamber 10 is returned to its original state. In this case, ink is introduced into the pressure chamber 10 from the manifold passage 5.

In another driving method, it is possible to previously place the individual electrode 35 and the common electrode 34 at different potentials. In this case, whenever the discharge of ink is necessary, the individual electrode 35 and the common electrode 34 are set to the same potential. After that, the individual electrode 35 and the common electrode 34 are set again to different potentials at a predetermined timing. In this case, at the timing at which the individual electrode 35 and the common electrode 34 are set to the same potential, the piezoelectric sheets 41 to 44 are returned to their original state. As a result, the volume of the pressure chamber 10 is increased as compared to the initial state of the pressure chamber 10 (the state at which the potentials of the electrodes are different from each other), and therefore, ink is introduced into the pressure chamber 10 from the manifold passage 5. After that, at the timing at which the individual electrode 35 and the common electrode 34 are set again to different potentials, the piezoelectric sheets 41 to 44 are deformed such that the piezoelectric sheets 41 to 44 protrude toward the pressure chamber 10. Consequently, the volume of the pressure chamber 10 is decreased, and therefore, the pressure of the ink in the pressure chamber 10 is increased. As a result, the ink extruded from the pressure chamber 10 is discharged from the nozzle 8. In this way, the ink is discharged from the nozzle 8, and at the same time, the ink jet head 1 is moved in the main scanning direction, and therefore, desired pictures are printed on paper.

Figure 7:
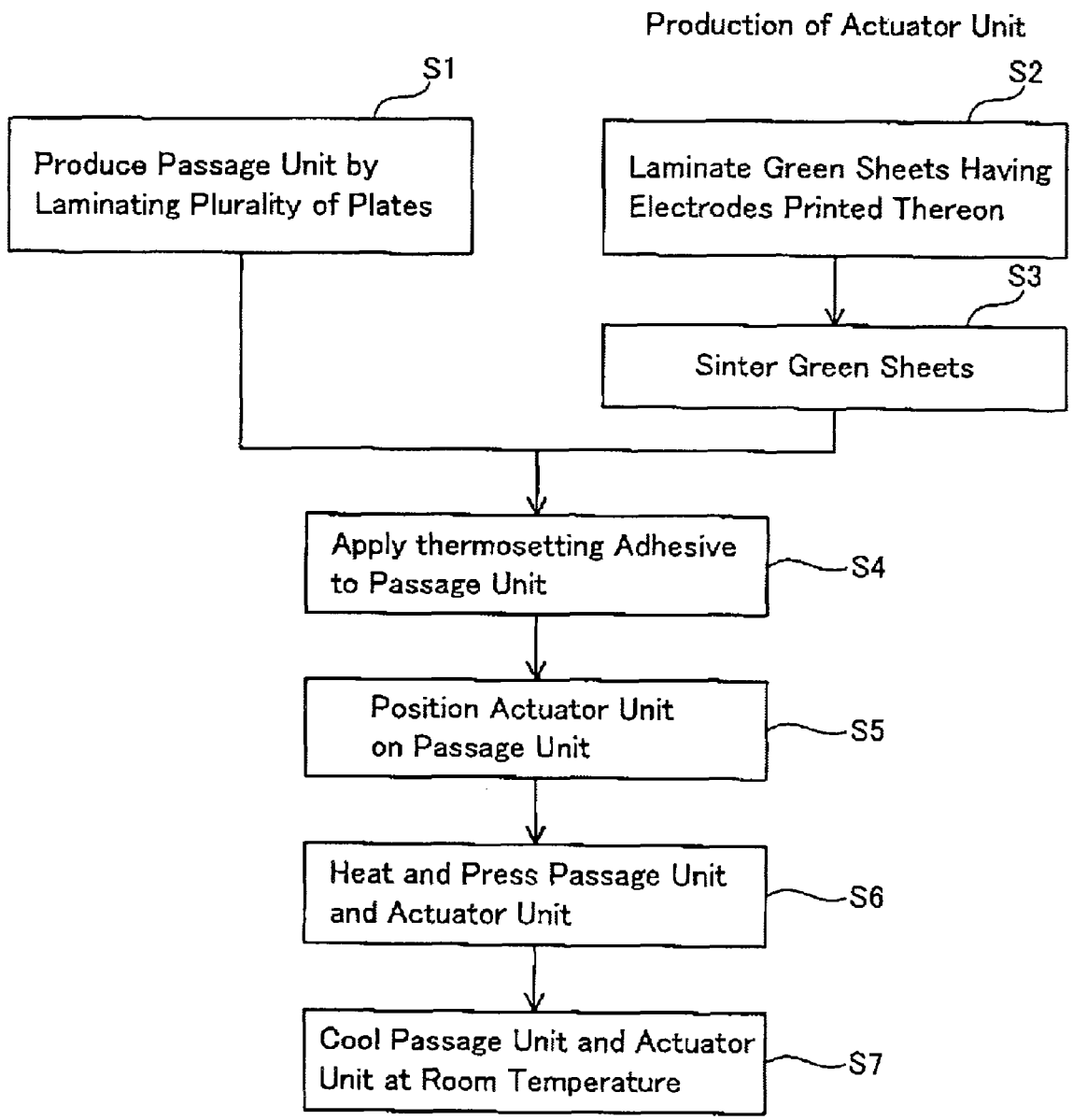
FIG. 7 shows a flow chart illustrating an ink jet head manufacturing process.

A method of manufacturing the ink jet head 1 with the above-stated construction will now be described in detail with reference to FIGS. 7 and 8. FIG. 7 shows a flow chart illustrating a process of manufacturing the head body 7.

First, the passage unit 4 and the actuator unit 21 are separately produced in order to manufacture the ink jet head 1. After that, the produced parts are assembled. As shown in FIG. 7, the passage unit 4 is produced (S1). In order to produce the passage unit 4, the respective plates 22 to 30 constituting the passage unit 4 are etched using a patterned photoresist as a mask such that the holes (see FIG. 5) are formed at the respective plates 22 to 30. After that, the nine plates 22 to 30, which are aligned to form the individual ink passages 7, are laminated one on another by means of thermosetting adhesive. Subsequently, the nine plates 22 to 30 are pressed while the nine plates 22 to 30 are heated to a temperature higher than the setting temperature of the thermosetting adhesive. As a result, the thermosetting adhesive is hardened, and therefore, the nine plates 22 to 30 are securely attached to each other. In this way, the passage unit 4 as shown in FIG. 5 is produced.

In order to produce the actuator unit 21, on the other hand, a plurality of green sheets, which are made of a piezoelectric ceramic material, are prepared (S2). The green sheets are formed in consideration of the amount of contraction due to preliminary sintering. Conductive paste is screen printed on the surface of one of the green sheets in a pattern of the common electrode 34, and the green sheets are aligned using a jig. After that, the green sheet having the conductive paste printed in the pattern of the common electrode 34 on the surface thereof is attached to the lower surface of one of the green sheets on which the conductive paste is not printed, and two of the green sheets on which the conductive paste is not printed are attached to the lower surface of the green sheet having the conductive paste printed in the pattern of the common electrode 34 on the surface thereof.

Next, the laminated body obtained at Step S2 is degreased in the same manner as conventional ceramics and is sintered at a predetermined temperature (S3). As a result, the four green sheets become the piezoelectric sheets 41 to 44, and the conductive paste becomes the common electrode 34. After that, conductive paste is screen printed on the piezoelectric sheet 41, which is the uppermost layer, in a pattern of the individual electrode 35. The conductive paste is sintered by heating the laminated body, and the individual electrode 35 is formed on the piezoelectric sheet 41. Subsequently, gold containing glass frit is printed on the individual electrode 35 to form the land 36. In his way, the actuator unit 21 as shown in FIG. 6 (a) is produced.

The passage unit producing process (S1) and the actuator unit producing process (S2,S3) are separately carried out. Consequently, it is possible to carry out any one of the passage unit producing process and the actuator unit producing process before the other is carried out or to simultaneously carry out the passage unit producing process and the actuator unit producing process.

Subsequently, thermosetting adhesive having a thermosetting temperature of approximately 80° C. is applied to the surface of the passage unit 4 where a plurality of holes are formed in correspondence to the pressure chambers 10 using a bar coater (S4). For example, two-liquid mixed type adhesive is used as the thermosetting adhesive.

Next, the actuator units 21 are placed on the thermosetting adhesive layer applied to the passage unit 4. At this time, the respective actuator units 21 are positioned with respect to the passage unit 4 such that the individual electrodes 35 and the pressure chambers 10 are opposite to each other (S5). This positioning step is carried out based on positioning marks (not shown) formed at the passage unit 4 and the actuator units 21 at Steps S1 to S3.

Subsequently, the laminated body constituted by the passage unit 4, the thermosetting adhesive disposed between the passage unit 4 and the actuator units 21, and the actuator units 21, are pressed while the laminated body is heated to a temperature higher than the setting temperature of the thermosetting adhesive by a heating and pressing apparatus (S6). As a result, the individual passages 7, through which the pressure chambers 10 are connected to the nozzles 8, are formed. After that, the laminated body is taken out of the heating and pressing apparatus, and is then cooled in a natural cooling fashion (S7). In this way, the head body 70 including the passage unit 4 and the actuator units 21 is manufactured.

Figure 8:
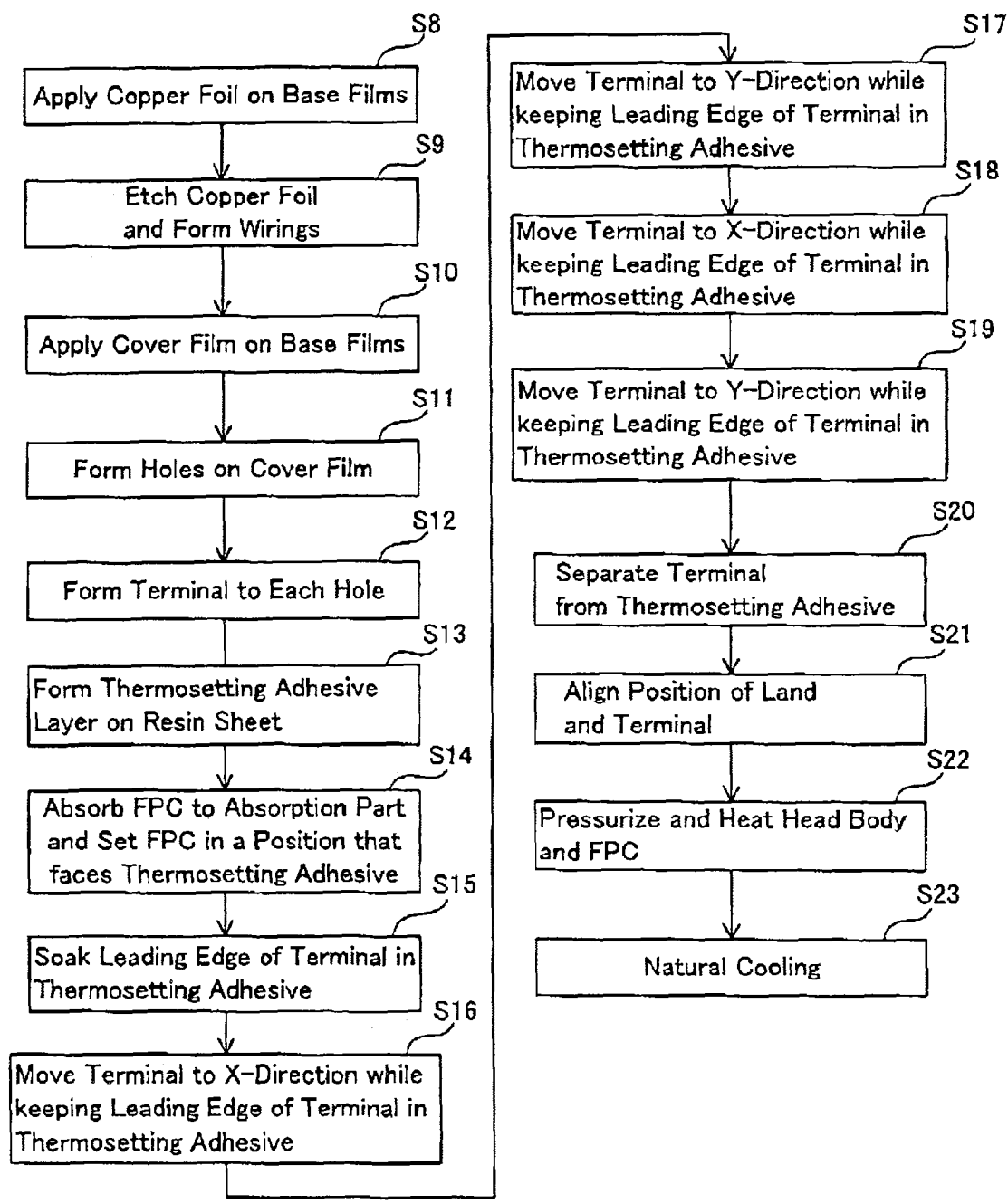
FIG. 8 shows a flow chart illustrating the ink jet head manufacturing process.

Steps S8 to S12 of FIG. 8 show a flow chart of a manufacturing process of the FPC 50.

First, the base film 49, which is made of a polyimide resin, is prepared, and a copper foil is applied to the entirety of one surface of the base film 49 by means of adhesive (S8). Subsequently, photoresist is formed on the surface of the copper foil in a predetermined pattern, and then the copper foil is etched with the photoresist being used as a mask. Consequently, the copper foil is removed except at the part of the copper foil to form the plurality of wirings 48. Then, the photoresist is removed (S9). Subsequently, the photosensitive cover film 40 is applied to the surface of the base film 49 where the wirings 49 are formed by means of adhesive (S10). Subsequently, the through-holes 45 are formed in the cover film 40 at the positions opposite to the lands 36, specifically, at the positions partially opposite to the ends of the wirings 48 (S11). In this case, a mask having a pattern corresponding to the through-holes 45 is formed, and then the through-holes 45 are formed by photolithography in the same manner as the wirings 48. Subsequently, the main terminal bodies 52, which are made of nickel by electric plating are formed at the parts of the wirings 48 which are exposed by the through-holes 45 such that the main terminal bodies 52 protrude downward from the lower surface 40a of the cover film 40 (S12). After that, the solder films 53, which are made of a tin-silver-copper alloy, are formed on the surfaces of the main terminal bodies 52 by electric plating. In this way, the FPC 50 is manufactured through Steps S8 to S2.

Figure 9:
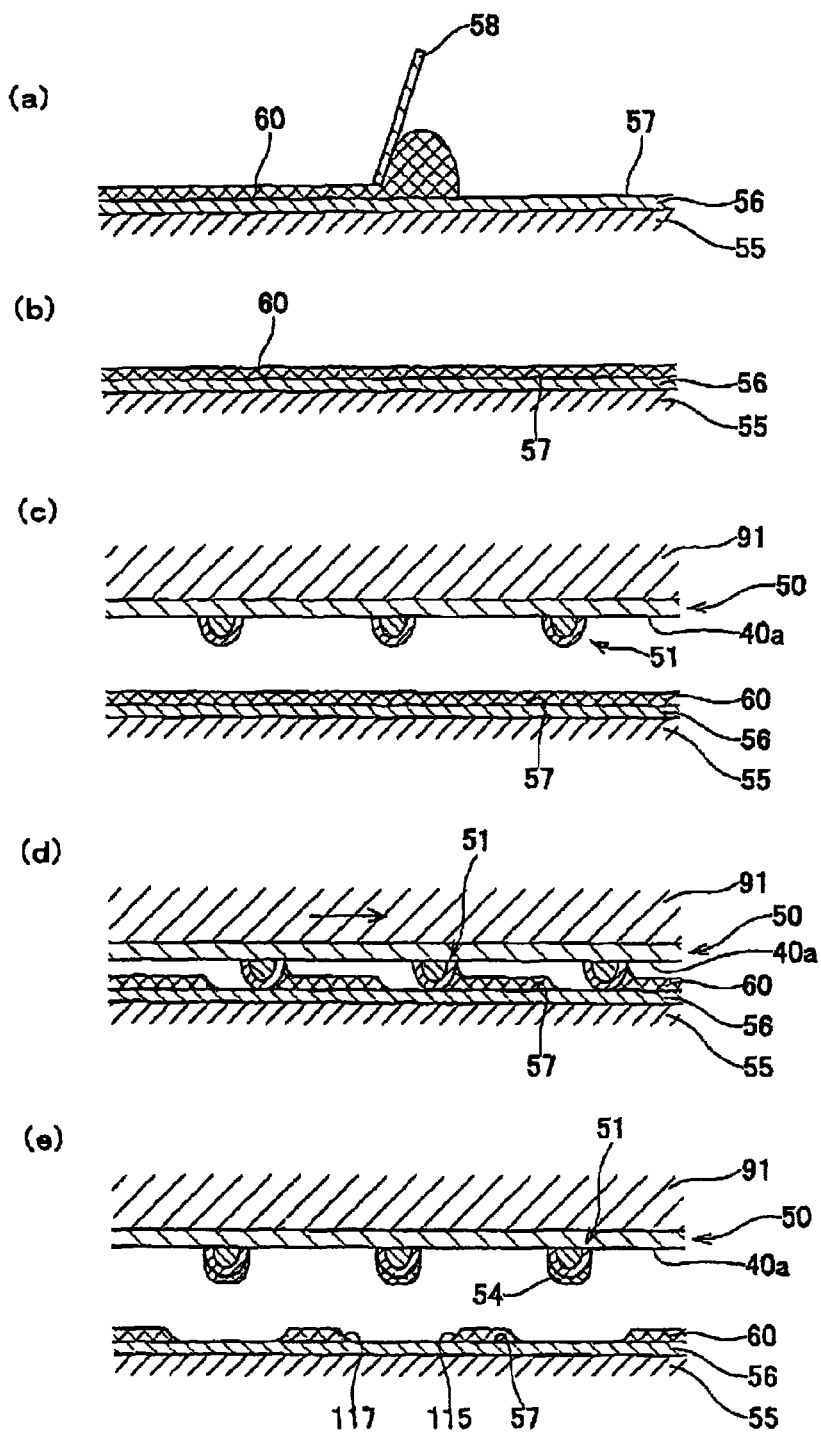
FIG. 9 shows sectional views illustrating a process of applying adhesive to protruding terminals formed on the FPC.

FIG. 9 show sectional views illustrating a process of applying the thermosetting adhesive 54 to the protruding terminals 51. First, a thermosetting adhesive layer 60 having constant thickness is formed on a resin sheet 56, which is disposed on a stage 55 (S13). FIGS. 9 (a) and 9 (b) illustrate a process of forming the thermosetting adhesive layer 60. First, as shown in FIG. 9 (a), a large amount of thermosetting adhesive is put on a flat upper surface 57 of the resin sheet 56 disposed on the stage 55. After that, a scraper 58 is moved in the direction indicated by the arrow in the drawing (from the left side to the right side of the drawing) such that the thermosetting adhesive layer 60 has a predetermined thickness. As a result, as shown in FIG. 9 (b), the thermosetting adhesive layer 60 having constant thickness is formed on the resin sheet 56. In this embodiment, the thickness of the thermosetting adhesive layer 60 is less than the height of each protruding terminal 51, which protrudes downward from the lower surface 40a of the cover film 40. Subsequently, as shown in FIG. 9 (c), the FPC 50 is adsorbed to an adsorption part 91, and the FPC 50 is arranged such that the protruding terminals 51 are opposite to the thermosetting adhesive layer 60 (S14). After that, as shown in FIG. 9 (d), the protruding terminals 51 are brought into contact with the thermosetting adhesive layer 60 (S15), and then the adsorption part 91 is moved in parallel with the surface of the stage 55 while the protruding terminals 51 are in contact with the thermosetting adhesive layer 60 (S16 to S19). Subsequently, as shown in FIG. 9 (e), the protruding terminals 51 are separated from the thermosetting adhesive layer 60 (S20). In this way, the thermosetting adhesive 54 is applied to the protruding terminals 51.

A method of moving the adsorption part 91 in parallel with the surface of the stage 55 will now be described in detail.

Figure 10:
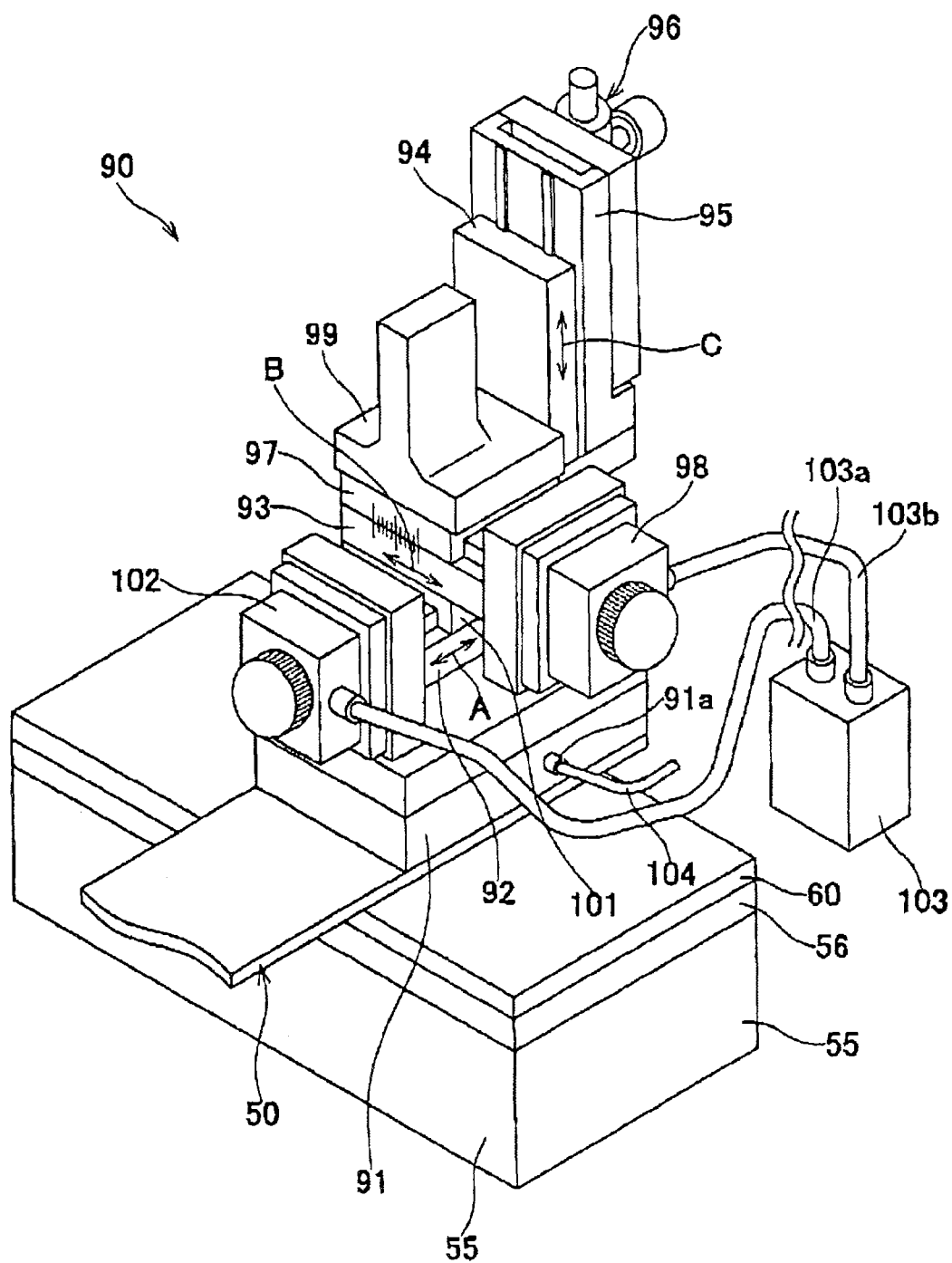
FIG. 10 shows a perspective view schematically illustrating a transferring apparatus.

FIG. 10 shows a perspective view schematically illustrating a transferring apparatus 90 that is capable of moving the adsorption part of FIG. 9 in a X-direction, a Y-direction, and a Z-direction, which are perpendicular to each other.

The transferring apparatus 90 includes an adsorption part 91 for absorbing the FPC 50, a Y-stage 92 for supporting the adsorption part 91 such that the adsorption part 91 can be reciprocated in the Y-direction (the direction indicated by an arrow A in FIG. 10), an X-stage 93 for supporting the adsorption part 91 and the Y-stage 92 such that the adsorption part 91 and the Y-stage 92 can be reciprocated in the X-direction (the direction indicated by an arrow B in FIG. 10), a Z-stage 94 for supporting the adsorption part 91, the Y-stage 92, and X-stage 93 such that the adsorption part 91 the Y-stage 92, and X-stage 93 can be reciprocated in the Z-direction (the direction indicated by an arrow C in FIG. 10), a guide member 95 fixed to the apparatus body (not shown) for supporting the Z-stage 94 such that the Z-stage 94 can be reciprocated in the Z-direction, and a cylinder 96 fixed to the rear surface of the guide member 95 for moving the Z-stage 94 in the Z-direction.

On the X-stage 93 is disposed a guide member 97 for supporting the X-stage 93 such that the X-stage 93 can be reciprocated in the X-direction. At one end of the X-stage 93 is mounted a motor 98 for reciprocating the X-stage 93 in the X-direction. On the guide member 97 is disposed a connection part 99, which is fixed to the Z-stage 94 and the guide member 97. Specifically, the guide member 97 and the Z-stage 94 are connected to each other via the connection part 99. On the Y-stage 92 is disposed a guide member 101 for supporting the Y-stage 92 such that the Y-stage 92 can be reciprocated in the Y-direction. The guide member 101 is fixed to the lower surface of the X-stage 93. At one end of the Y-stage 92 is mounted a motor 102 for reciprocating the Y-stage 92 in the Y-direction. The motors 98 and 102 are connected to a motor controller 103 via cables 103a and 103b. The motors 98 and 102 can be driven independently or simultaneously according to a drive command from the motor controller 103. Consequently, the Y-stage 92 can be moved independently in the Y-direction. Similarly, the X-stage 93 can be moved independently in the X-direction. Also, the cylinder 96 is connected to a cylinder controller (not shown). The cylinder 96 can be expanded and contracted, according to a drive command from the cylinder controller, to move the Z-stage 94 in the Z-direction.

At the lower surface of the adsorption part 91 are formed a plurality of suction holes (not shown), which are uniformly distributed over the lower surface of the adsorption part 91. At the side surface of the adsorption part 91 is formed a discharge part 91a, which communicates with the suction holes formed at the lower surface of the adsorption part 91 in the adsorption part 91. To the discharge part 91a is connected a tube 104, which is also connected to an air suctioning apparatus (not shown). When the air suctioning apparatus is driven, external air is suctioned through the plurality of suction holes formed at the lower surface of the adsorption part 91. Specifically, the adsorption part 91 absorbs the FPC 50 at the lower surface of the adsorption part 91 when the air suctioning apparatus is driven.

In this embodiment, the adsorption part 91 is moved by the transferring apparatus 90 according to Step S115 to S20 of FIG. 8. First, the Z-stage 94 is moved until the leading edges of the protruding terminals 51 are brought into contact with the resin sheet 56, and the leading edges of the protruding terminals 51 are soaked in the thermosetting adhesive layer 60 (S15). At this time, since the thickness of the thermosetting adhesive layer 60 is less than the height of each protruding terminal 51, which protrudes downward from the lower surface 40a of the cover film 40, a gap is formed between the lower surface of the FPC 50 (i.e., the lower surface 40a) and the thermosetting adhesive layer 60. For this reason, the thermosetting adhesive, which forms the thermosetting adhesive layer 60, is not attached to the lower surface 40a of the cover film 40.

Subsequently, the protruding terminals 51 are reciprocated in the X-direction and the Y-direction. The movement paths of each protruding terminal 51 will be described in detail with reference to FIG. 11. Although only one of the plurality of protruding terminals 51 is shown in FIG. 11, the other protruding terminals 51 are also moved in the same manner as shown in FIG. 9 (d). The point where the leading edge of the protruding terminal 51 and the leading edge of the resin sheet 56 first contact each other will be referred to hereinafter as the origin 110.

First, the protruding terminal 51 is moved by a predetermined distance along a direction 111 (a first direction) in parallel with the X-direction (the direction indicated by an arrow A in FIG. 11) such that the protruding terminal 51 is separated from the origin 110. Specifically, the X-stage 93 of the transferring apparatus 90 is moved by the predetermined distance in the X-direction. At this time, the thermosetting adhesive at the movement direction side of the protruding terminal 51 is gathered by the protruding terminal 51, and therefore, the part of the thermosetting adhesive adjacent to the protruding terminal 51 rises (see FIG. 9 (d)). As a result, the thermosetting adhesive is applied to the protruding terminal 51 from the leading edge to the root of the protruding terminal 51 at the movement direction side of the protruding terminal 51. Subsequently, the protruding terminal 51 is moved toward the origin 110 along the direction 111 such that the protruding terminal 51 is returned to the origin 110 (S16). Specifically, the X-stage 93 of the transferring apparatus 90 is moved in the X-direction such that the X-stage 93 is returned to its original position. At this time, the thermosetting adhesive flows into the movement track 115 from the circumference of the movement track 115, even if a groove-shaped movement track 115 of the thermosetting adhesive layer 60, which is formed by the movement of the protruding terminal 51, does not return to its original state (the thickness of the thermosetting adhesive layer 60 before the protruding terminal 51 is moved). For this reason, when the protruding terminal 51 is moved to the origin 110, the thermosetting adhesive at the movement direction side of the protruding terminal 51 is gathered by the protruding terminal 51, and therefore, the part of the thermosetting adhesive adjacent to the protruding terminal 51 rises. As a result, when the protruding terminal 51 is moved toward the origin 110, the thermosetting adhesive is also applied to the protruding terminal 51 at the movement direction side of the protruding terminal 51, although the amount of the thermosetting adhesive applied to the protruding terminal 51 when the protruding terminal 51 is moved toward the origin 110 is less than that of the thermosetting adhesive applied to the protruding terminal 51 when the protruding terminal 51 is moved away from the origin 110.

Subsequently, in the same manner as Step S16, the protruding terminal 51 is reciprocated by a predetermined distance along a direction 112 (a second direction) in parallel with the Y-direction (the direction indicated by an arrow B in FIG. 11) from the origin 110 (S17). Specifically, the Y-stage 92 of the transferring apparatus 90 is reciprocated by the predetermined distance in the Y-direction. As a result, when the protruding terminal 51 is moved away from the origin 110, the thermosetting adhesive at the movement direction side of the protruding terminal 51 is gathered by the protruding terminal 51, and therefore, the thermosetting adhesive is applied to the protruding terminal 51 from the leading edge to the root of the protruding terminal 51. For the same reason as when the protruding terminal 51 is moved in the first direction, when the protruding terminal 51 is moved toward the origin 110, the thermosetting adhesive is also applied to the protruding terminal 51 at the movement direction side of the protruding terminal 51.

Subsequently, in the same manner as Steps S16 and S17, the protruding terminal 51 is reciprocated by a predetermined distance along a direction 113 (a third direction) in parallel with the X-direction from the origin 110 (S18). Specifically, the X-stage 93 of the transferring apparatus 90 is reciprocated by the predetermined distance in the X-direction. As a result, when the protruding terminal 51 is moved away from the origin 110, the thermosetting adhesive is applied to the protruding terminal 51 from the leading edge to the root of the protruding terminal 51 at the movement direction side of the protruding terminal 51. Also, when the protruding terminal 51 is moved toward the origin 110, the thermosetting adhesive is applied to the protruding terminal 51 at the movement direction side of the protruding terminal 51. At Step S18, the thermosetting adhesive is further applied to the protruding terminal 51 in addition to the thermosetting adhesive applied to the protruding terminal 51 at Step S16. Consequently, the thermosetting adhesive is applied almost uniformly to the opposite sides of the protruding terminal 51 in the X-direction from the leading edge to the root of the protruding terminal 51.

Subsequently, the protruding terminal 51 is reciprocated by a predetermined distance along a direction 114 (a fourth direction) in parallel with the Y-direction from the origin 110 (S19). Specifically, the Y-stage 92 of the transferring apparatus 90 is reciprocated by the predetermined distance in the Y-direction. For the same reason as Step S18, the thermosetting adhesive is applied almost uniformly to the opposite sides of the protruding terminal 51 in the Y-direction from the leading edge to the root of the protruding terminal 51.

Subsequently, the protruding terminal 51 is separated from the thermosetting adhesive layer 60 (S20). Specifically, the Z-stage 94 of the transferring apparatus 90 is moved in the Z-direction (the direction indicated by an arrow C in FIG. 10) such that the Z-stage 94 is moved away from the stage 55. In this way, the thermosetting adhesive 54 is applied to all the circumference of the protruding terminal 51 from the leading edge to the root of the protruding terminal 51.

In this embodiment, as shown in FIG. 11 the protruding terminal 51 is moved in a cross-shaped pattern. At Step S16 to S19, the movement distances of the protruding terminal 51 are the same, and the movement paths of the neighboring protruding terminals 51 do not intersect with each other. Specifically, the movement tracks 115 to 118 shown in FIG. 11 do not overlap with the movement tracks of the other protruding terminals 51. Also, the origin 110 is the start point, at which the movement of the protruding terminal 51 starts, and the end point, at which the movement of the protruding terminal 51 ends, at Step S16 to S19.

Now, a process of joining the head body 70 and the FPC 50 will be described (S21 to S23 of FIG. 8). FIG. 12 (a) to 12 (c) are views illustrating a process of joining the head body 70 and the FPC 50. First, as shown in FIG. 12 (a), the FPC 50 held by the adsorption part 91 is positioned such that the land 36 and the protruding terminal 51 are opposite to each other (S21). Subsequently, as shown in FIG. 12 (b), the Z-stage 94 of the transferring apparatus 90 is moved downward such that the protruding terminal 51 is pressed against the land 36. While the protruding terminal 51 is pressed against the land 36, the FPC 50 and the head body 70 are heated by a heating apparatus (not shown). In this way, the protruding terminal 51 is temporarily joined to the land 36 (S22).

While the protruding terminal 51 is temporarily joined to the land 36, as shown in FIG. 12B, the thermosetting adhesive 54 applied to the surface of the protruding terminal 51 is moved such that the protruding terminal 51 and the land 36 are surrounded by the thermosetting adhesive 54. Subsequently, the FPC 50 and the head body 70 are heated to a temperature higher than the setting temperature of the thermosetting adhesive 54 and a temperature lower than the melting point of the solder film 53 and the melting point of the main terminal body 52. For example, the FPC 50 and the head body 70 are heated to 200° C. After that, the FPC 50 and the head body 70 are maintained at 200° C. for a predetermined period of time. In this way, the solder film 53 of the protruding terminal 51 is softened, and therefore, the solder film 53 is deformed from the state of the solder film 53 shown in FIG. 12 (b) to the state of the solder film 53 shown in FIG. 12 (c). As a result, the contact area between the protruding terminal 51 and the land 36 is increased. Furthermore, the hardening of the thermosetting adhesive 54 is progressed while the contact area between the protruding terminal 51 and the land 36 is increased. After that, the FPC 50 and the actuator unit 21 are cooled in a natural cooling fashion (S23). In this way, the protruding terminal 51 and the land 36 are electrically connected with each other, and the actuator unit 21 and the FPC are joined to each other by means of the thermosetting adhesive 54.

Subsequently, the base block 71 and the holder 72 are also joined, and therefore, the ink jet head 1 shown in FIGS. 1 and 2 is finished.

In the method of applying the thermosetting adhesive to the protruding terminal 51 according to this embodiment, the leading edge of the protruding terminal 51 is moved while the leading edge of the protruding terminal 51 is soaked in the thermosetting adhesive layer 60, and therefore, the thermosetting adhesive is gathered by the protruding terminal 51.

At this time, the thermosetting adhesive at the movement direction side of the protruding terminal 51 is gathered by the protruding terminal 51, and therefore, the part of the thermosetting adhesive adjacent to the protruding terminal 51 rises. Consequently, the thermosetting adhesive is applied to the protruding terminal 51 from the leading edge to the root of the protruding terminal 51. In this way, it is possible to apply the thermosetting adhesive to the protruding terminal 51 from the leading edge to the root of the protruding terminal 51 without unnecessary attachment of the thermosetting adhesive to the FPC 50. Also, the thermosetting adhesive is not attached to the remaining part of the FPC 50 except the protruding terminal 51. Consequently, a process of removing the thermosetting adhesive from the remaining part of the FPC 50 except the protruding terminal 51 is not necessary. Also, since the thermosetting adhesive is applied to the protruding terminal 51 from the leading edge to the root of the protruding terminal 51, the joining force between the FPC 50 and the actuator unit 21 is increased. Furthermore, since the direction in which the thermosetting adhesive layer 60 is moved by the protruding terminal 51 is the perpendicular direction, it is possible to uniformly apply the thermosetting adhesive in the circumferential direction of the root of the protruding terminal 51.

Also, since the thermosetting adhesive layer 60 is formed with constant thickness, occurrence of the difference in the amount of the thermosetting adhesive applied to the respective protruding terminals 51 is effectively prevented. Consequently, it is possible to uniformly join the actuator unit 21 and the FPC 50 to each other. Also, when the protruding terminal 51 is soaked in the thermosetting adhesive layer 60, the leading edge of the protruding terminal 51 is brought into contact with the upper surface 57 of the resin sheet 56, and therefore, the gap is formed between the FPC 50 and the thermosetting adhesive layer 60. As a result, any special control to prevent the thermosetting adhesive from being attached to the lower surface 40a of the FPC 50 is not necessary. For example, when the protruding terminal 51 is moved while the protruding terminal 51 is in contact with the thermosetting adhesive layer 60, it is not necessary to control the movement of the Z-stage 94 of the transferring apparatus 90.

Furthermore, the heating temperature applied when the FPC 50 and the actuator unit 21 are joined to each other is below the melting point of the solder film 53. Consequently, the solder film 53 is softened; however, the solder film 53 is not melted into a liquid state. As a result, the gap between the land 36 and the protruding terminal 51 is filled with the solder, and therefore, the electrical contact area between the land 36 and the protruding terminal 51 is increased. Also, the solder film 53 is prevented from flowing out of the region surrounded by the thermosetting adhesive 54. As the solder film 53 remains inside the thermosetting adhesive 54, the protruding terminals 51 do not electrically connect to each other and therefore any short circuit between the protruding terminals 51 is prevented.

A second preferred embodiment of the present invention will be described in detail with the accompanying drawings. The second preferred embodiment is identical to the first preferred embodiment except that the movement path of each protruding terminal according to the second preferred embodiment is different from the movement paths of each protruding terminal according to the first preferred embodiment, and the heating temperature for the FPC 50 and the head body 70 according to the second preferred embodiment is different from that according to the first preferred embodiment. For this reason, the components of the second preferred embodiment, which are identical to those of the first preferred embodiment, are given the same reference numerals as those of the first preferred embodiment, and a detailed description thereof will not be given. The movement path of the protruding terminal in the thermosetting adhesive layer 60 and the joining between the FPC 50 and the head body 70 will be described below.

FIG. 13 shows a view illustrating the movement path of a protruding terminal 51' formed on the FPC 50. In this embodiment, the protruding terminal 51' is moved along the circumferential direction (the direction indicated by an arrow E in FIG. 13), as shown in FIG. 13, while the protruding terminal 51' is soaked in the thermosetting adhesive layer 60. The origin 210 is a point at which the leading edge of the protruding terminal 51' is initially brought into contact with the upper surface 57 of the resin sheet 56. The origin 210 is the start point, at which the movement of the protruding terminal 51' starts, and the end point, at which the movement of the protruding terminal 51' ends. In order that the protruding terminal 51' is moved in the circumferential direction as shown in FIG. 13, the Y-direction movement (the direction indicated by an arrow B in FIG. 13) of the Y-stage 92 of the transferring apparatus 90 and the X-direction movement (the direction indicated by an arrow A in FIG. 13) of the X-stage 93 of the transferring apparatus 90 are alternately carried out to a slight degree. Furthermore, since the Y-stage 92 and the X-stage 93 are independently constructed, it is possible to simultaneously move the Y-stage 92 and the X-stage 93. As the protruding terminal 51' is moved in the circumferential direction, a groove-shaped circumferential track 211 is formed in the thermosetting adhesive layer 60. When the protruding terminal 51' is moved in the circumferential direction, the circular track 211 is formed while the thermosetting adhesive is gathered by the protruding terminal 51'. Consequently, the rising part of the thermosetting adhesive is continuously formed in front of the movement direction of the protruding terminal 51'. As a result, the thermosetting adhesive is applied to the protruding terminal 51' from the leading edge to the root of the protruding terminal 51' all over the circumference of the protruding terminal 51'. Furthermore, since the protruding terminal 51' is moved in the circumferential direction, it is possible to more uniformly apply the thermosetting adhesive in the circumferential direction of the root of the protruding terminal than the first embodiment, whereby the thermosetting adhesive is more uniformly applied to the protruding terminal 51' all over the circumference of the protruding terminal 51' than in the first embodiment.

Figure 14:
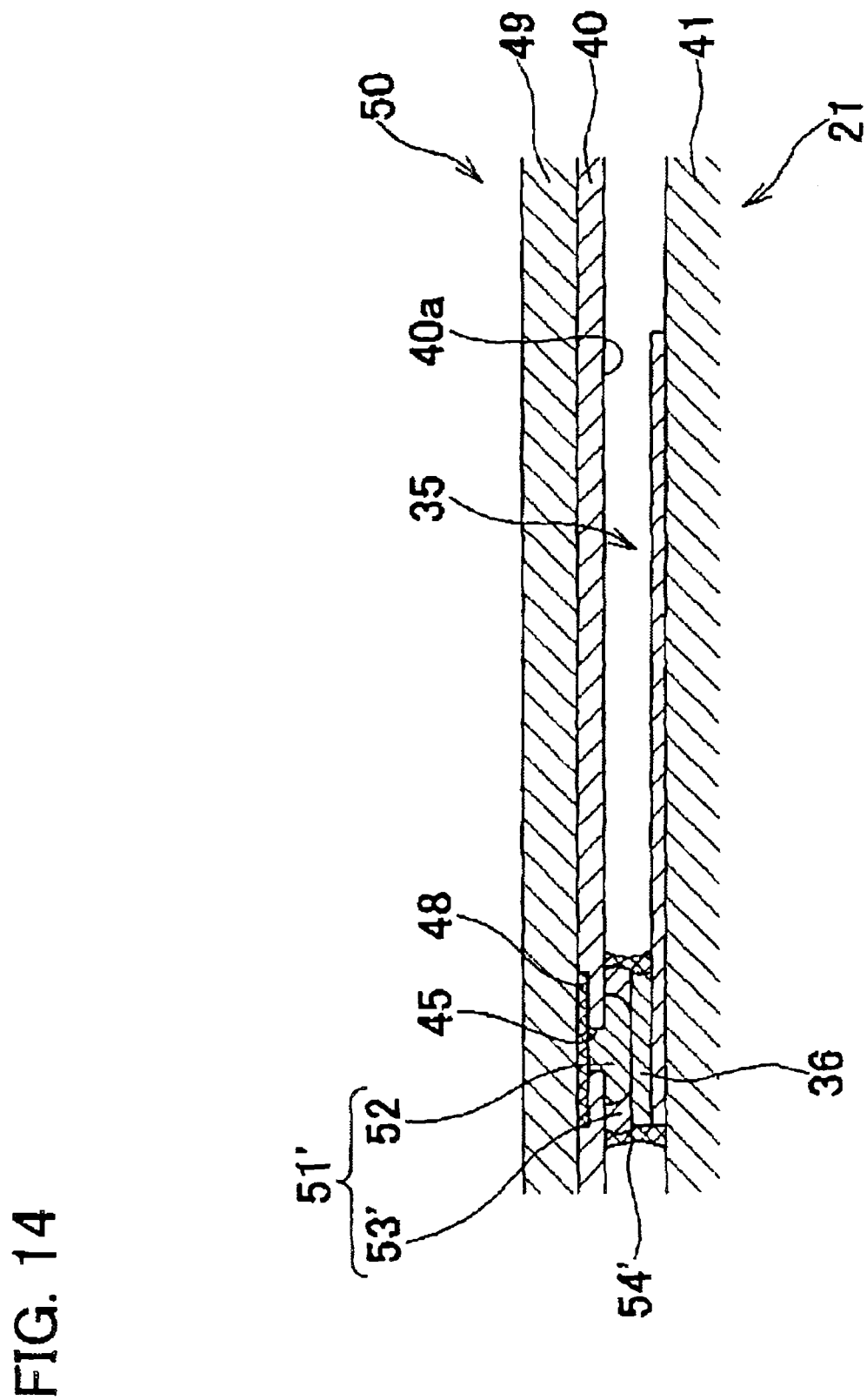
FIG. 14 shows a sectional view illustrating the head body and the FPC, which are joined to each other by a joining method according to a second preferred embodiment of the present invention.

Next, the FPC 50 and the head body 70 are aligned with each other such that the protruding terminal 51' is opposite to the land 36. Subsequently, the Z-stage 94 is moved downward such that the protruding terminal 51' is pressed against the land 36. While the protruding terminal 51' is pressed against the land 36, the FPC 50 and the head body 70 are heated. In this embodiment, the FPC 50 and the head body 70 are heated to a temperature higher than the setting temperature of the thermosetting adhesive and the melting point of the solder film 53' and a temperature lower than and the melting point of the main terminal body 52. For example, the FPC 50 and the head body 70 are heated to 220° C. After that, the FPC 50 and the head body 70 are maintained at 220° C. for a predetermined period of time such that the thermosetting adhesive 54' is hardened. After that, the FPC 50 and the actuator unit 21 are cooled in a natural cooling fashion. In this way, the solder film 53' of the protruding terminal 51' is melted, and therefore, as shown in FIG. 14, the surface of the main terminal body 52 and the surface of the land 36 are brought into direct contact with each other. At this time, since the thermosetting adhesive 54' is present around the solder film 53', the melted solder film 53' is prevented from flowing out of the thermosetting adhesive 54'. As a result, the protruding terminals 51' are electrically connected to each other, and therefore, any short circuit between the protruding terminals 51' is prevented. Furthermore, since the solder film 53' is melted and then hardened, the coupling force between the protruding terminal 51' and the land 36 is increased.

Although the preferred embodiments of the present invention have been described in detail above, the present invention is not limited to the above-described preferred embodiments. Various modifications and substitutions of the present invention are possible without departing from the spirit of the invention.

For example, in the first preferred embodiment, the origin 110 is the start point, at which the movement of the protruding terminal starts, and the end point, at which the movement of the protruding terminal ends. Furthermore, the protruding terminal is reciprocated in four directions. However, it is also possible to move the protruding terminal only in one direction along the upper surface of the resin sheet 56. Even in this case, the thermosetting adhesive is attached to the root of the protruding terminal at the surface side of the protruding terminal in the direction where the protruding terminal is initially moved. Consequently, it is possible to apply more thermosetting adhesive to the protruding terminal than when the protruding terminal is soaked only in the thermosetting adhesive layer. Furthermore, it is possible to reciprocate the protruding terminal in one direction along the upper surface of the resin sheet 56. Even in this case, when the protruding terminal is moved away from the origin, the thermosetting adhesive is attached to the root of the protruding terminal at the surface side of the protruding terminal in the direction where the protruding terminal is moved, and, when the protruding terminal is returned from the origin, the thermosetting adhesive is attached to the root of the protruding terminal at the surface side of the protruding terminal in the direction where the protruding terminal is moved. Consequently, more thermosetting adhesive is applied to the root of the protruding terminal along the circumference of the protruding terminal.

Also, the protruding terminal 51 is moved in the two perpendicular directions, i.e., in the X-direction and the Y-direction according to the first preferred embodiment. However, the two directions may not be perpendicular to each other. In this case, more thermosetting adhesive is applied to the root of the protruding terminal along the circumference of the protruding terminal than when the protruding terminal is reciprocated in one direction. In any modifications, when the solder film is melted, the solder is prevented from flowing out of the thermosetting adhesive in the direction where the thermosetting adhesive is applied.

Furthermore, in the first preferred embodiment of the present invention, after the head body is formed (S1 to S7), the FPC is formed and the thermosetting adhesive is applied to the protruding terminal (S8 to S20). However, it is possible to carry out Steps S8 to S20 before Steps S1 to S7 are carried out. Alternatively, Steps S8 to S20 and Steps S1 to S7 may be simultaneously carried out.

In the above-described first preferred embodiment, after the passage unit and the actuator unit are joined to each other, the FPC is joined to the actuator unit. However, it is possible to join the actuator unit and the passage unit after the actuator unit and the FPC are joined to each other.

Also, in the second preferred embodiment, the protruding terminal is moved along the circumferential direction. However, it is possible to move the protruding terminal along the triangular direction, the rectangular direction, the polygonal direction, and the elliptic direction.

Also, in the above-described preferred embodiment, the protruding terminal is moved only in the directions (the X-direction and Y-direction) parallel with the surface of the resin sheet while the leading edge of the protruding terminal is in contact with the thermosetting adhesive layer. However, it is possible to move the protruding terminal in the direction (the Z-direction) perpendicular to the surface of the resin sheet while the leading edge of the protruding terminal is in contact with the thermosetting adhesive layer. In this case, for example, after the leading edge of the protruding terminal is brought into contact with the upper surface of the resin sheet, the leading edge of the protruding terminal is lifted to the vicinity of the surface of the thermosetting adhesive layer, and then the protruding terminal may be moved in the direction parallel with the surface of the resin sheet. According to this method, it is possible to apply the thermosetting adhesive to the protruding terminal from the leading edge to the root of the protruding terminal, and, it is also possible to control the amount of the thermosetting adhesive applied to the protruding terminal.

In the above-described embodiment, when the thermosetting adhesive is applied to the protruding terminal, the FPC is moved by the transferring apparatus. However, it is possible to fix the FPC and to move the stage having the thermosetting adhesive layer formed thereon in the X-direction, the Y-direction, and the Z-direction. Furthermore, it is possible to move both the transferring apparatus and the stage having the thermosetting adhesive layer formed thereon such that the thermosetting adhesive is applied to the protruding terminal.

Although the thermosetting adhesive is applied to the protruding terminal in the above-described embodiment, for example, conductive or insulating thermoplastic adhesive and conductive thermosetting adhesive may be also used. ID other words, the kinds of adhesive may be selected according to the use or the purpose of the adhesive.

Also, in the above-described embodiment, the thickness of the thermosetting adhesive is less than the height from the lower surface of the FPC to the leading edge of the protruding terminal. However, the thickness of the thermosetting adhesive may be greater than the height from the lower surface of the FPC to the leading edge of the protruding terminal. In this case, it is possible to move the protruding terminal, while maintaining the gap between the protruding terminal and the thermosetting adhesive layer, such that the lower surface of the FPC does not contact the thermosetting adhesive layer.

In the above-described embodiment, the leading edge of the protruding terminal is flat. However, the protruding terminal may be formed such that the leading edge of the protruding terminal is not flat. The protruding terminal and the land may be brought into contact with each other. For example, the leading edge of the protruding terminal may be round.

Furthermore, the adhesive application method of applying the adhesive to the protruding terminal disclosed in the above-described embodiment can be used in various other applications in addition to the ink jet head. Similarly, the terminal joining method of joining the protruding terminal formed on a substrate and the corresponding protruding terminal formed on another substrate can be used in various other applications in addition to the ink jet head.

Furthermore, the technical components described in the specification and shown in the accompanying drawings may be used independently or in any possible combination thereof, whereby the technical usability of the technical components is accomplished, and the technical components are not restricted to the combination recited in the claims when the present application was filed. Also, the technology illustrated in the specification and the drawings simultaneously accomplishes a plurality of objects, and the present invention has the technical usability even when only one of the objects is accomplished by the present invention.

What is claimed is:

1. An adhesive application method of applying adhesive to a protruding part formed on a flexible printed circuit, wherein the adhesive application method comprises:
    a protruding part forming step of forming the protruding part which protrudes from the flexible printed circuit;
    an adhesive preparing step of forming an adhesive layer on the surface of a plate member;
    a positioning step of positioning, after the adhesive preparing step, the protruding part formed in the protruding part forming step at a position facing the adhesive layer;
    an adhesive applying step of allowing, after the positioning step, a leading edge of the protruding part and the adhesive layer to be brought into contact with each other such that the surface of the substrate around the protruding part does not contact the adhesive layer; and
    a moving step of automatically moving the flexible printed circuit and the plate member relative to each other by using a transferring apparatus, wherein the moving step comprises:
        a first step of moving the flexible printed circuit toward the surface of the plate member along a direction perpendicular to the surface of the plate member while the leading edge of the protruding part and the adhesive layer are in contact with each other,
        a second step of moving, after the first step, the flexible printed circuit in a first direction for a first predetermined distance from an origin, which is a position at which the leading edge of the protruding part and the adhesive layer contacts each other, and then moving the flexible printed circuit in a second direction within a plane parallel with the surface of the plate member for a second predetermined distance from the origin, wherein the second direction is not parallel with the first direction and forms a predetermined angle with the first direction, and the second step is performed while the surface of the flexible printed circuit around the protruding part is not in contact with the adhesive layer, and the leading edge of the protruding part and the adhesive layer are in contact with each other; and
        a third step of moving the flexible printed circuit away from the surface of the plate member along the direction perpendicular to the surface of the plate member after the second step.

2. The adhesive application method as set forth in claim 1, wherein the maximally protruding portion of the protruding part is parallel with the flexible printed circuit.

3. The adhesive application method as set forth in claim 1, wherein, at the moving step, the flexible printed circuit and the plate member are reciprocated relative to each other in the plane parallel with the surface of the plate member in the first direction, and the flexible printed circuit and the plate member are reciprocated relative to each other in the plane parallel with the surface of the plate member in the second direction.

4. The adhesive application method as set forth in claim 3, wherein the first direction and the second direction are perpendicular to each other.

5. The adhesive application method as set forth in claim 1, wherein, at the adhesive preparing step, the thickness of the adhesive layer formed on the surface of the plate member is uniform.

6. The adhesive application method as set forth in claim 1, wherein
    at the adhesive preparing step, the thickness of the adhesive layer is less than the distance from the leading edge of the protruding part formed on the flexible printed circuit to the surface of the flexible printed circuit around the protruding part, and
    at the adhesive applying step, the leading edge of the protruding part is brought into contact with the surface of the plate member.

7. A terminal joining method of joining a protruding terminal formed on a flexible printed circuit and a terminal formed on a substrate, wherein the terminal joining method comprises:
    a protruding terminal forming step of forming the protruding terminal which protrudes from the flexible printed circuit;
    a terminal forming step of forming the terminal on the substrate;
    an adhesive preparing step of forming an adhesive layer on the surface of a plate member;
    a positioning step of positioning, after the adhesive preparing step, the protruding terminal formed in the protruding terminal forming step at a position facing the adhesive layer;
    an adhesive applying step of allowing, after the positioning step, a leading edge of the protruding terminal of the flexible printed circuit and the adhesive layer to be brought into contact with each other such that the surface of the flexible printed circuit does not contact the adhesive layer;
    a moving step of automatically moving the flexible printed circuit and the plate member relative to each other by using a transferring apparatus, wherein the moving step comprises:
        a first step of moving the flexible printed circuit toward the surface of the plate member along a direction perpendicular to the surface of the plate member while the leading edge of the protruding terminal of the flexible printed circuit and the adhesive layer are in contact with each other, a second step of moving, after the first step, the flexible printed circuit in a first direction for a first predetermined distance from an origin, which is a position at which the leading edge of the protruding part and the adhesive layer contacts each other, and then moving the flexible printed circuit in a second direction within a plane parallel with the surface of the plate member for a second predetermined distance from the origin, wherein the second direction is not parallel with the first direction and forms a predetermined angle with the first direction, and the second step is performed while the surface of the flexible printed circuit around the protruding part is not in contact with the adhesive layer, and the leading edge of the protruding part and the adhesive layer are in contact with each other; and a third step of moving the flexible printed circuit away from the surface of the plate member along the direction perpendicular to the surface of the plate member after the second step; and a joining step of heating and pressing the protruding terminal of the flexible printed circuit and the terminal of the substrate while the protruding terminal of the flexible printed circuit and the terminal of the substrate are in contact with each other.

8. The terminal joining method as set forth in claim 7, further comprising:

a solder film forming step of forming a solder film such that the protruding terminal of the flexible printed circuit is covered by the solder film, the solder film having a melting point less than that of the material constituting the protruding terminal of the flexible printed circuit, wherein at the adhesive preparing step, a thermosetting adhesive layer is formed on the surface of the plate member, and at the joining step, the protruding terminal of the flexible printed circuit and the terminal of the substrate are heated to a temperature higher than the setting temperature of the thermosetting adhesive and a temperature lower than the melting point of the material constituting the protruding terminal of the flexible printed circuit and the melting point of solder constituting the solder film.

9. The terminal joining method as set forth in claim 7, further comprising:

a solder film forming step of forming a solder film such that the protruding terminal of the flexible printed circuit is covered by the solder film, the solder film having a melting point less than that of the material constituting the protruding terminal of the flexible printed circuit, wherein at the adhesive preparing step, a thermosetting adhesive layer is formed on the surface of the plate member, and at the joining step, the protruding terminal of the flexible printed circuit and the terminal of the substrate are heated to a temperature higher than the melting point of solder constituting the solder film and the setting temperature of the thermosetting adhesive and a temperature lower than the melting point of the material constituting the protruding terminal of the flexible printed circuit.

10. The terminal joining method as set forth in claim 9, wherein the solder film is made of a solder containing no lead.

11. The terminal joining method as set forth in claim 7, wherein the protruding terminal of the flexible printed circuit is made of a metal mainly containing nickel.

12. The terminal joining method as set forth in claim 7, wherein at the adhesive preparing step, the thickness of the adhesive layer is less than the distance from the leading edge of the protruding terminal of the flexible printed circuit formed on the flexible printed circuit to the surface of the flexible printed circuit around the protruding terminal, and at the first step of moving, the flexible printed circuit and the plate member are moved relative to each other in the plane parallel with the surface of the plate member while the leading edge of the protruding terminal of the flexible printed circuit is in contact with the surface of the plate member.

13. The adhesive application method of claim 1, wherein the moving step further comprises a fourth step of moving the flexible printed circuit away from the surface of the plate member along the direction perpendicular to the surface of the plate member between the first step and the second step while the leading edge of the protruding part and the adhesive layer are in contact with each other.

14. The terminal joining method of claim 7, wherein the moving step further comprises a fourth step of moving the flexible printed circuit away from the surface of the plate member along the direction perpendicular to the surface of the plate member between the first step and the second step while the leading edge of the protruding terminal of the flexible printed circuit and the adhesive layer are in contact with each other.

15. The adhesive application method of claim 1, wherein the second step of moving further comprises:

reciprocating the flexible printed circuit from the origin for the first predetermined distance along the first direction; and reciprocating the flexible printed circuit from the origin for the second predetermined distance along the second direction.

16. The terminal joining method of claim 7, wherein the second step of moving further comprises:

reciprocating the flexible printed circuit from the origin for the first predetermined distance along the first direction; and reciprocating the flexible printed circuit from the origin for the second predetermined distance along the second direction.

* * * * *